(12) United States Patent
Larson et al.

(10) Patent No.: US 7,902,585 B2
(45) Date of Patent: Mar. 8, 2011

(54) LINEAR VARIABLE VOLTAGE DIODE CAPACITOR AND ADAPTIVE MATCHING NETWORKS

(75) Inventors: Lawrence E. Larson, Del Mar, CA (US); Leonardus C. N. de Vreede, Pijnacker (NL)

(73) Assignees: Technical University Delft, Delft (NL); The Regents of the University of California, Oakland, CA (US)

( * ) Notice: Subject to any disclaimer, the term of this patent is extended or adjusted under 35 U.S.C. 154(b) by 454 days.

(21) Appl. No.: 11/920,935

(22) PCT Filed: Jun. 6, 2006

(86) PCT No.: PCT/US2006/021872
§ 371 (c)(1),
(2), (4) Date: Apr. 21, 2008

(87) PCT Pub. No.: WO2006/133159
PCT Pub. Date: Dec. 14, 2006

(65) Prior Publication Data
US 2009/0134960 A1 May 28, 2009

Related U.S. Application Data

(60) Provisional application No. 60/688,644, filed on Jun. 8, 2005.

(51) Int. Cl.
*H01L 29/94* (2006.01)
(52) U.S. Cl. ......... 257/312; 333/174; 333/176; 455/302; 361/278; 343/745; 343/702; 438/379
(58) Field of Classification Search .................. 333/174, 333/176; 455/302; 361/278; 334/78; 343/745, 343/702; 257/312, E29.344; 438/379
See application file for complete search history.

(56) References Cited

U.S. PATENT DOCUMENTS 6,472,956 B2 * 10/2002 Kosuga ......................... 333/174
2003/0090347 A1 5/2003 Losehand et al.

OTHER PUBLICATIONS

Blondy, P., et. al., "Applications of RF Mems to Tunable Filters and Matching Networks", *CAS 2001*, Oct. 2001.
Buisman, K., et. al. "'Distortion Free' Varactor Diode Topologies for RF Adaptivity", *2005 IEEE IMS*.

(Continued)

*Primary Examiner* — Michael B Shingleton
(74) *Attorney, Agent, or Firm* — Greer, Burns & Crain Ltd.

(57) ABSTRACT

An integrated variable voltage diode capacitor topology applied to a circuit providing a variable voltage load for controlling variable capacitance. The topology includes a first pair of anti-series varactor diodes, wherein the diode power-law exponent n for the first pair of anti-series varactor diodes in the circuit is equal or greater than 0.5, and the first pair of anti-series varactor diodes have an unequal size ratio that is set to control third-order distortion. The topology also includes a center tap between the first pair anti-series varactor diodes for application of the variable voltage load. In preferred embodiments, a second pair of anti-series varactor diodes is arranged anti-parallel to the first pair of anti-series varactor diodes so the combination of the first pair of anti-series varactor diodes and the second pair of anti-series varactor diodes control second-order distortion as well.

10 Claims, 16 Drawing Sheets

OTHER PUBLICATIONS

Leuzzi, G., et. al., "Variable-Load Constant Efficiency Power Amplifiers For Mobile Communications Applications", *EuMC 2003*, Oct. 7-9, 2003.

McIntosh, C., et. al. "Novel MMIC Source-Impedance Tuners for On-Wafer Microwave Noise-Parameter Measurements", *IEEE Trans. MTT*, vol. 47, Feb. 1999.

Padmini, P., et. al., "Realization of high tunability barium strontium titanate thin films by rf magnetron sputtering", *Applied Physics Letters*, vol. 75, No. 20, Nov. 15, 1999.

Papapolymerou, J., et. al., "Reconfigurable Double-Stub Tuners Using MEMS Switches for Intelligent RF Front-Ends", *IEEE Trans. MTT*, vol. 51, No. 1, Jan. 2003.

Raab, F.H., et. al., "High-Efficiency Linear Amplification by Dynamic Load Modulation", *IEEE IMS 2003*.

Spirito, et. al. "A Novel Active Harmonic Load-Pull Setup for On-Wafer Device Linearity Characterization", *MTT-S 2004*, Jun. 6-11, 2004.

Van Beek, J., "High-Q integrated RF passives and RF-MEMS on silicon", *BCTM*, Sep. 2003.

* cited by examiner

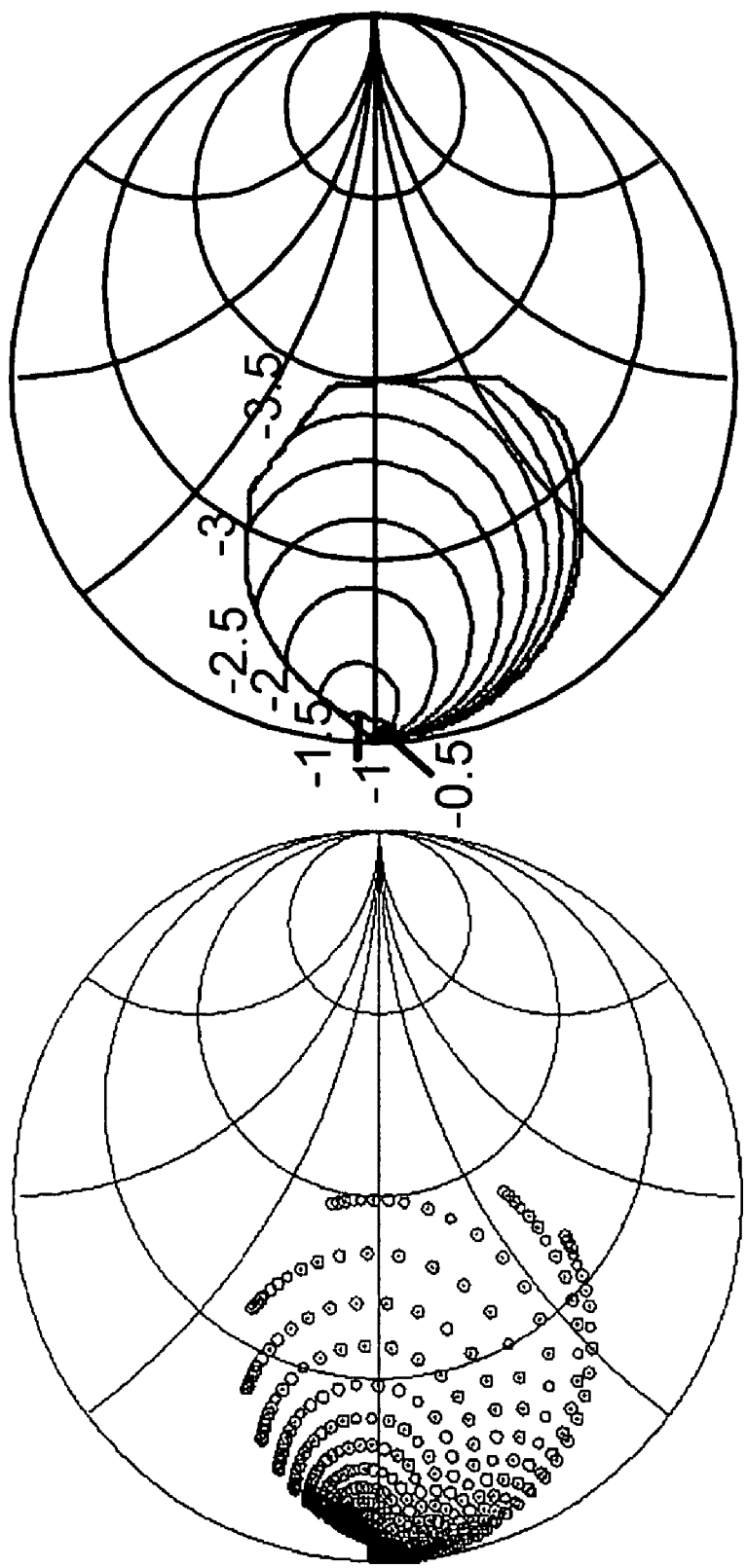

LINEAR VARIABLE VOLTAGE DIODE CAPACITOR AND ADAPTIVE MATCHING NETWORKS

PRIORITY CLAIM AND REFERENCE TO RELATED APPLICATION

This application claims priority under 35 U.S.C. §119 from pending provisional application Ser. No. 60/688,644, filed Jun. 8, 2005.

FIELD

The invention is the field of electronics and semiconductor circuits. An example application of the invention is to high frequency electronic circuits, e.g., radio frequency circuits such as cellular handset circuits. Other example applications of the invention are to tunable filters, dynamic tuners for power amplifiers, switches, and voltage controlled oscillators.

BACKGROUND

Diode capacitors are used in a wide range of circuits. Nonlinear response to a variable voltage condition limits the usefulness of diode capacitors in certain applications. The nonlinearity may have to be addressed with supplemental circuitry in some cases. In other cases, the nonlinearity may limit the operational range of the circuit.

As an example, voltage variable (or tunable) diode capacitors are used extensively in high-frequency electronic design applications. Cellular handset circuits, for example, use voltage variable diode capacitors in voltage controlled oscillators that are used for tuning. Voltage variable diode capacitors are used in a wide variety of additional circuits, including, for example, tunable filters and high-frequency switches. Their utility and performance are compromised as the capacitance of the diodes used to construct the variable voltage capacitors varies nonlinearly with the voltage applied to the capacitor. With higher signal levels, the nonlinearity creates intermodulation and cross-modulation distortion. Such distortion can limit circuit performance.

In R. G. Meyer and M. Stephens "Distortion in Variable Capacitance Diodes," IEEE J. of Solid-State Circuits, vol. SC-10, no. 1, 1975, variable capacitor diodes are discussed. The paper discusses the anti-parallel connection of two varactor (voltage variable reactance) diodes to realize a composite voltage variable capacitor with improved linearity. In a special case referred to as the abrupt junction case, nonlinearities are cancelled, and the resulting configuration is almost perfectly linear. However, nonlinearity cancellation is less effective outside of the abrupt junction special case, minimizing the general utility of the technique. The abrupt junction case requires maintenance of a large dc bias voltage range to realize a large capacitance variation.

Variable diode capacitors are used in RF and microwave circuits, for example. Such circuits also use matching networks. Reducing loss with adaptive matching networks holds promise for the further advancement of RF and microwave circuits. For example, low loss adaptive matching networks can be used to tune the matching conditions for power amplifiers to dynamically optimize the load impedance, in order to provide the best performance at varying output powers and antenna conditions. Other example uses of adaptive passive networks are for tunable filters, multi-band radios, and reconfigurable RF systems.

Typical variable capacitance circuits use varactor diodes for tuning. Applications of these circuits include voltage controlled oscillators, tunable filters, switches, phase shifters and tunable impedance matching networks. Achieving low-distortion in these circuits is highly desirable—especially for large-signal applications like power amplifiers.

Some alternative strategies for variable capacitance circuits are being researched. One example are capacitors based upon microelectromechanical systems (MEMS). MEMS capacitors provide a very high Quality Factor (Q) and extraordinarily high linearity, but require non-standard processing and packaging techniques, and high control voltages. Additionally, and their reliability and switching speed are still poor compared to semiconductor-based solutions. Other proposed tuning techniques, based on voltage-variable dielectrics, exhibit similar drawbacks of manufacturability and performance.

In view of such integration issues, varactor diodes seem a logical choice for implementing RF adaptivity. However, their inherently nonlinear behavior disqualifies them for use with modern communication standards characterized by high peak-to-average power ratios, and their related Q factors are usually too low at the microwave frequencies of interest for the most demanding applications.

In particular, next-generation wireless systems, such as multi-mode transceivers and "cognitive radios," require circuit techniques that facilitate RF adaptivity. Some examples of adaptive circuits include tunable filters, tunable matching networks for low-noise and power amplifiers, and multi-band VCO's. An ideal tuning element for these applications will exhibit extremely low loss, low dc power consumption, high linearity, ruggedness to high voltage and high current, wide tuning range, high reliability, very low cost, low area usage, and be continuously tunable, with a high tuning speed.

PIN Diodes or GaAs pseudomorphic high electron mobility transistors (PHEMTs) are commonly used today for these challenging applications. However, these solutions are considered to be too expensive, or to consume too much dc power, to be an acceptable long term solution for cost and performance sensitive applications.

SUMMARY OF INVENTION

The invention provides a highly linear voltage variable diode capacitor. A preferred embodiment includes a plurality of varactor diodes. There are anti-series and anti-parallel connections of the varactor diodes. The varactor diodes are sized and the connections are arranged to minimize second and third-order distortion. In a preferred embodiment of the invention, four nonlinear voltage variable reactance (varactor) diodes are arranged such that the resulting variable capacitor can be made almost perfectly linear, even though the four diodes that comprise it are themselves highly nonlinear. The only requirement on the four varactor diodes is that their capacitance nonlinearity be known a priori, and that the nonlinearity satisfy a certain minimum exponential relationship to the applied voltage. Embodiments of the invention provide a linear voltage variable diode capacitor with a high-tuning range, a high Quality factor, and high linearity.

An preferred embodiment integrated variable voltage diode capacitor topology applied to a circuit providing a variable voltage load for controlling variable capacitance. The topology includes a first pair of anti-series varactor diodes (10, 12, 14, 16), wherein the diode power-law exponent n for the first pair of anti-series varactor diodes in the circuit is equal or greater than 0.5, and the first pair of anti-series varactor diodes have an unequal size ratio that is set to control third-order distortion. The topology also includes a center tap between the first pair anti-series varactor diodes for application of the variable voltage load. In preferred embodiments, a second pair of anti-series varactor diodes is arranged anti-parallel to the first pair of anti-series varactor diodes so the combination of the first pair of anti-series varactor diodes and the second pair of anti-series varactor diodes control second-order distortion as well.

In embodiments of the invention, a low distortion varactor is applied to low-loss, silicon-on-glass technology, which can be used, for example, for the implementation of integrated tuners for adaptive matching. Close-to-ideal continuously variable tuning capabilities make these networks suitable for providing optimum loading conditions an RF circuit output stage, for example, under varying output power or antenna matching conditions.

BRIEF DESCRIPTION OF THE DRAWINGS

FIG. 14A shows the measured values of $s_{11}$ at 2 GHz for the experimental tuner in accordance with FIG. 13; and FIG. 14B plots the measured loss contours (Gp in dB) at all the different tuning points, the losses range from 0.5 dB at 1$\Omega$ to 3.5 dB for $Z_{in}=40\Omega$ for the experimental tuner in accordance with FIG. 13.

DETAILED DESCRIPTION OF THE PREFERRED EMBODIMENTS

Figure 1B:
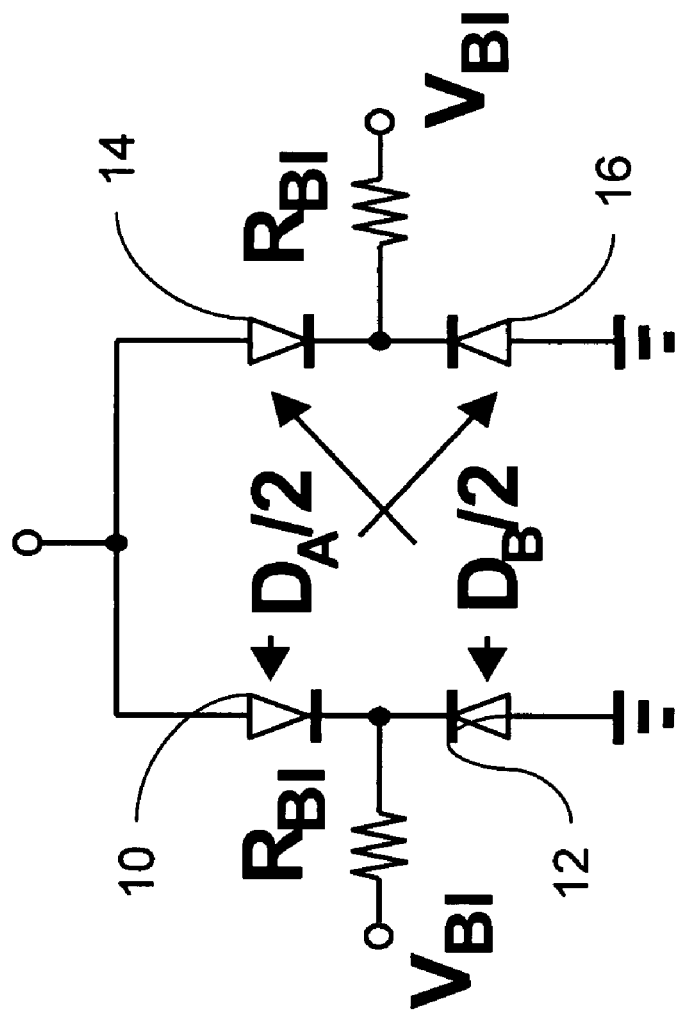
FIGS. 1A and 1B respectively show an anti-series, and anti-series/anti-parallel circuit topology used in embodiments of the invention.

The invention provides a linear variable voltage diode capacitor varactor diode-based circuit having, in preferred embodiments, substantially no second or third order distortion. Integrated circuit topologies of the invention and a high performance varactor diode process technology are provided. For a given diode power-law capacitance coefficient ($n \geq 0.5$), varactor diode based circuits of the invention can act as variable capacitors with extremely low or, in the special case of $n=0.5$, theoretically no distortion when the ratio of nonidentical diode areas in an anti-series configuration is properly set.

Ultra-low distortion varactor topologies of the invention will have many applications, including for RF adaptivity in next generation wireless applications. Example application circuits have been fabricated and tested; including a substantially distortion free varactor stack (DFVS), providing theoretically no distortion, and a high tuning range varactor stack (HTRVS), which provides a higher tuning range with only a very small amount of nonlinear distortion. Center tap loading by the control voltage circuitry is addressed by providing a sufficiently high AC impedance to avoid linearity degradation for signals with low-tone spacing. In the preferred embodiment of the anti-series varactor diode variable capacitors, an anti-parallel diode bias pair in the center tap connection is used to minimize or eliminate linearity degradation.

In other embodiments, the use of multiple stacked anti-series varactors improves voltage handling and capacitance tuning range when dealing with large RF signals. Linearity is improved for a given center tap impedance.

A preferred embodiment of varactor-based topologies use silicon-on-glass integration. In preferred embodiments, both sides of an intrinsic varactor are contacted by low-ohmic thick-metal contacts, and extremely high Q's can be obtained even for very large capacitance values. The high performance of these structures in terms of low losses, linearity, tuning range, speed, and low cost, makes them suitable for many applications, including, e.g., the implementation of tunable filters, switches and adaptive matching networks.

Preferred example embodiment tuners have a close-to-ideal continuously variable tuning capability, making them very suitable for providing optimum loading conditions to a power amplifier output stage, under varying output power or antenna matching conditions. Experimental embodiments achieved high performance of the filter and tuner networks in terms of loss, size, cost, tuning range, power handling and linearity, and are compatible with current requirements in modern communication systems. A contemplated application is to provide true RF adaptivity, which can dramatically improve the performance of wireless systems.

Preferred embodiment diode based variable capacitors of the invention are formed in silicon, and a preferred embodiment is a silicon on glass fabrication. Embodiments of the invention provide a linear variable voltage diode capacitor varactor diode-based circuit formed by a silicon-based process technology having a quality factor (Q) in a range from about 100 to over 500 at 2 GHz with capacitance values up to 50 pF, and with extremely low parasitic capacitances. However, other material systems can be used, including Group III-V material systems.

Preferred embodiments will be discussed with respect to the drawings. Operational and design theory for preferred embodiments will also be presented along with data relating to experimental embodiments. The invention is not limited by the operational and design theory, or the experimental data, but artisans will appreciate broader aspects of the invention and additional embodiments from the discussion thereof.

Figure 1A:
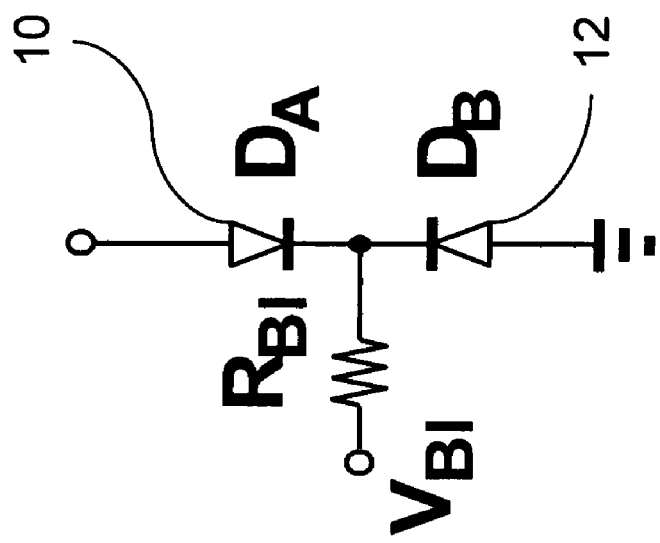
Figure 2B:
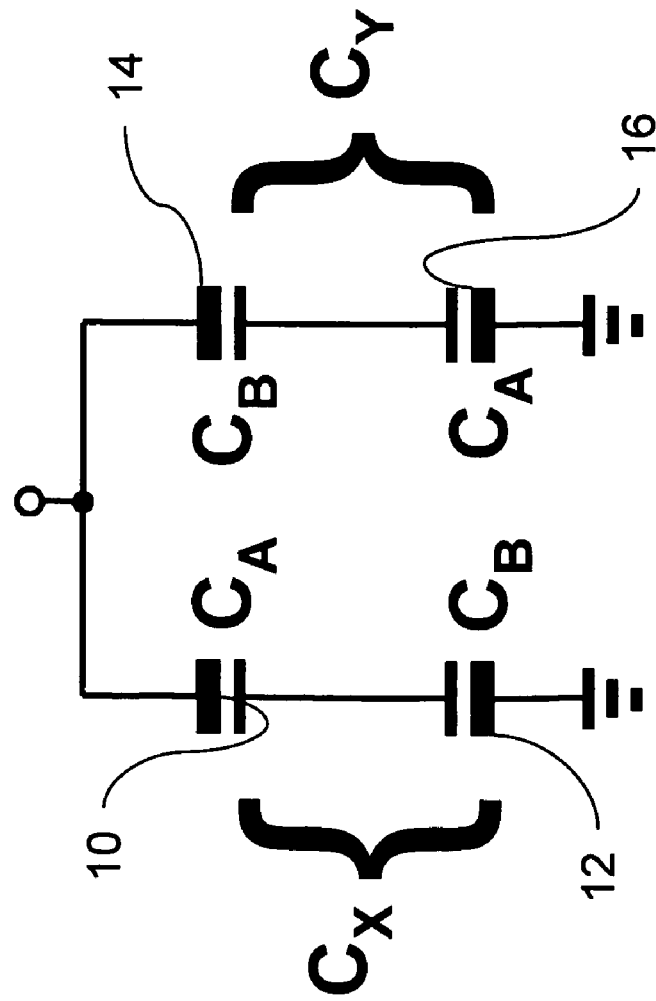
FIGS. 2A and 2B respectively illustrate the capacitances associated with the varactor diodes in the FIG. 1A and FIG. 1B circuit topologies.
Figure 2A:
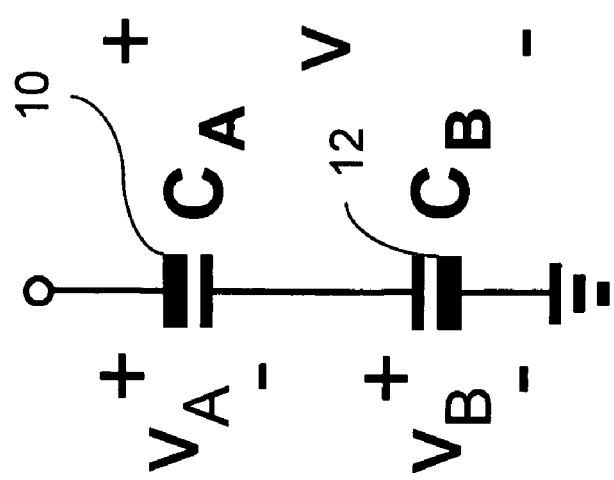

FIGS. 1A and 1B schematically illustrate preferred general topologies for a variable voltage varactor diode capacitor of the invention. The FIG. 1A topology is an anti-series connection of two varactor diodes 10 ($D_A$) and 12 ($D_B$) to minimize third-order distortion. The ratio of the areas of $D_A$ and $D_B$ determines the value of capacitance $C_2$ that is provided, which can be set to zero for n≧0.5. The FIG. 1B topology shows anti-series/anti-parallel connection of varactor diodes 10, 12, 14, 16 to minimize second and third-order distortion. In this case, both capacitances provided $C_1$ and $C_2$ can be set to zero. FIGS. 2A and 2B respectively illustrate the capacitances associated with the varactor diodes in the FIG. 1A and FIG. 1B circuit topologies.

Cancellation can only occur for cases where the diode power-law exponent n is greater than 0.5. This can be achieved by a number of fabrication techniques. A constant doping profile in the diode (the so-called "abrupt junction" case) results in an n=0.5 and the resulting ideal value of s is unity.

In cases where n>0.5 a method is provided to directly calculate the required diode area ratio to minimize $C_2$. As examples, in the case where n=1, the required area ratio is exactly two. In the case of n=2 the ideal hyper-abrupt junction diode—the required area ratio is 2.6. These values are straightforward to realize with high accuracy in any standard integrated circuit process that includes varactor diodes.

From equation (21) below, it is also clear that choosing a value of s≠1 in order to null $C_2$ will result in a finite value of $C_1$ and a potential for third-order distortion through second-order interaction. This interaction can be eliminated through placing the identical diodes in anti-parallel configuration, as shown in FIG. 1B. The linear capacitance of FIGS. 1A and 1B are the same, but the circuit of FIG. 1B can have $C_1$=0.

With reference to FIGS. 1B and 2B, the nonlinear capacitance terms in a varactor diode circuit can be set to zero for any value of diode capacitance power exponent n≧0.5 and by setting the ratio of the diode areas using equation (23) below. Operational theory, design, and experimental data will now be discussed to illustrate preferred embodiments of the invention, and to provide artisans with information to practice the preferred embodiments and variations thereof that are within the scope of the invention.

For a reverse-biased varactor diode, or any nonlinear capacitance, the current through the capacitor can be written in the most general way as:

$$i_c = C_0 \frac{dv}{dt} + \frac{C_1}{2}\frac{dv^2}{dt} + \frac{C_2}{3}\frac{dv^3}{dt} + \qquad (1)$$

where, v is the small-signal incremental voltage applied to the varactor, and the coefficients $C_0$, $C_1$, ... $C_n$ are the non-linear Taylor coefficients that depend on the dc operating point of the varactor, i.e., $$C(v) = \frac{dQ}{dv} = C_0 + C_1 v + C_2 v^2 + \qquad (2)$$

The coefficients $C_1$, ... $C_n$ are responsible for the generation of distortion products in the circuit. In particular, the second-order distortion created by $C_1$ and the third-order distortion created by $C_2$ should both be made as small as possible.

If two capacitors $C_A$ and $C_B$ are connected in the "anti-series" configuration, as shown in FIGS. 1A and 2A, then equation (3) can be written:

$$C_{A/B}(v_{A/B}) = C_{A0/B0} +/- C_{A1/B1}v_{A/B} + C_{A2/B2}v_{A/B}^2 + \dots \qquad (3)$$

where the minus sign in (3) comes from the reversed connection of $C_B$. When current flows through the capacitors, the incremental charge is given by $$Q(v_x) = \int_0^{v_x} C(v)dv \qquad (4)$$

In this case, the incremental charge on the two capacitors $C_A$ and $C_B$ is the same, and is given by $$Q(v_{A/B}) = C_{A0/B0}v_{A/B} + / - \frac{C_{A1/B1}}{2}v_{A/B}^2 + \frac{C_{A2/B2}}{3}v_{A/B}^3 \qquad (5)$$

since the two charges are equal, we can set $Q(v_A)=Q(v_B)$ =Q and solve for $v_A$ and $v_B$ through a series reversion. The total voltage across the series capacitor v is the sum of the two individual voltages $v_A$ and $v_B$, so $$v = S_0 Q + S_1 Q^2 + S_2 Q^3 + \qquad (6)$$

where $$S_0 = \left(\frac{1}{C_{A0}} + \frac{1}{2C_{B0}}\right), \qquad (7)$$

$$S_1 = \frac{C_{B1}}{2C_{B0}^3} - \frac{C_{A1}}{2C_{A0}^3} \qquad (8)$$

and $$S_2 = \frac{C_{A1}^2/2 - C_{A0}C_{A2}/3}{C_{A0}^5} + \frac{C_{B1}^2/2 - C_{B0}C_{D2}/3}{C_{B0}^5}. \qquad (9)$$

Taking the results from (6)-(9) and performing one last reversion and a differentiation yields:

$$C = C_0 + C_1 v + C_2 v^2 \qquad (10)$$

$$= \frac{1}{S_0} - \frac{2S_1}{S_0^3}v + \frac{6S_1^2 - 3S_0 S_2}{S_0^5}v^2,$$

where the linear and quadratic terms in v need to be minimized—ideally to zero—in order to reduce the distortion in the circuit. This result is essentially identical to that reported in R. G. Meyer and M. L. Stephens, "Distortion in variable-capacitance diodes," Journal of Solid-State Circuits, vol. SC-10, issue 1, pp. 47-55, February 1975. However, the invention provides practical and generalized low-distortion varactor topologies that provide specific solutions to the problem recognized in the art of reducing distortion. Also, artisans have previously assumed, based upon the use of identical varactors in the anti-series configuration, that identical varactors should be used in the anti-series and anti-parallel connection. This has limited the topology for achieving low distortion to the special case of n=0.5.

There are several possibilities for minimizing the $C_2$ term in (10), which is primarily responsible for the third-order distortion in the current. If the nonlinear capacitors are fabricated in the same semiconductor process and operated at the same dc bias, but their sizes differ by some constant s, then their nonlinear coefficients will each differ by s, i.e. $C_{B0}=sC_{A0}$, $C_{B1}=sC_{A1}$, and $C_{B2}=sC_{A2}$. In this case, the quadratic term in (10) ($C_2$) can be set to zero when;

$$s = \frac{3C_{A1}^2 + 2C_{A0}C_{A2} \pm \sqrt{9C_{A1}^2 + 12(C_{A1}^2 C_{A0} C_{A2} - C_{A0}^2 C_{A2}^2)}}{4C_{A0}C_{A2}}. \quad (11)$$

This was recognized in K. Buisman, et al., "Low-distortion, low loss varactor-based adaptive matching networks, implemented in a silicon-on-glass technology," in Proc. 2005 Radio Frequency IC Symp., Long Beach, Calif., June 2005, pp. 389-392; and by Q. Han, et al, "Perturbation analysis and experimental verification on intermodulation and harmonic distortion in an anti-series varactor pair," IEICE Trans. on Electronics, Vol. E88-C, No. 1, pp. 89-97, January 2005.

However, setting $C_2$ to zero will not completely eliminate third-order distortion in a circuit application, due to the second-order interaction between the $C_1$ and $C_0$ terms through the finite source impedance. Complete elimination of third-order distortion would also require that $C_1$ in (10) be eliminated. From (8), $C_1$ can only be set to zero for the case of two equal sized capacitors (s=1) with an identical grading coefficient, this is in contradiction to requirement for s, following from (11), for the elimination of $C_2$ in most cases.

To address this dilemma, it is recognized in the invention that the effect of a finite $C_1$ term can be independently eliminated, by the use of the anti-parallel connection of an identical network, as shown in FIGS. 1B and 2B, when a particular diode area ratio is used. With the anti-parallel connection of two nonlinear capacitors, $$C_x(v)=C_{x0}+C_{x1}v+C_{x2}v^2+\ldots \quad (12)$$

$$C_y(v)=C_{y0}-C_{y1}v+C_{y2}v^2+\ldots \quad (13)$$

the resulting total capacitance is then the sum of all the individual capacitances, i.e., $$C(v)=(C_{x0}+C_{y0})+C_{x1}-C_{y1})v+(C_{x2}+C_{y2})v^2+\ldots \quad (14)$$

If the topology uses size-matched diodes in the anti-parallel connection of FIGS. 1B and 2B, the following expression is obtained, $$C(v)=2C_{x0}+2C_{x2}v^2+\ldots \quad (15)$$

The result is perfect cancellation of all second-order components, which arise from the $C_1$ terms. Combining the results of (11)—canceling the third-order distortion (so $C_{x2}=0$)—with (15)—canceling second-order (and all even) distortion products—results in a capacitor with no residual distortion of order less than five, representing a substantial improvement.

To derive a mathematical description for the low distortion varactor configurations, we first recall the classical capacitance relation of a single varactor diode, which can be expressed as:

$$C(V) = \frac{K}{(\phi + V)^n} \quad (16)$$

where; $\phi$ is the built-in potential of the diode, V is the applied voltage, n is the power law exponent of the diode capacitance, and K is the capacitance constant. The power law exponent can exhibit wide variation in different situations, from a value of n≈0.3 for an implanted junction to n≈0.5 for a uniformly doped junction to n≈2 for a hyper-abrupt junction.

In order to develop the low distortion varactor diode circuits we first derive the Taylor coefficients of (16) yielding, $$C_0 = \frac{K}{(\phi + V_{B1})^n}, \quad (17)$$

$$C_1 = -C_0 \frac{n}{\phi + V_{B1}} \text{ and} \quad (18)$$

$$C_2 = C_0 \frac{n(n+1)}{2(\phi + V_{B1})^2}, \quad (19)$$

where $V_{B1}$ is the dc bias voltage on the diodes from FIG. 2.

The diode configuration represented in FIG. 1A can now be employed to realize a voltage variable capacitor with low third-order distortion. In this case, we set the ratio of the diode areas $D_B/D_A$ to be s as in (11) and—following the same procedure as in (6)-(10)—this yields expressions for the linear and nonlinear terms of the capacitance of the circuit of FIG. 2A of $$C_0 = \frac{sK_A}{(1+s)(\phi + V_{B1})^n}, \quad (20)$$

$$C_1 = \frac{(1-s)nC_0}{(1+s)(\phi + V_{B1})} \text{ and} \quad (21)$$

$$C_2 = \frac{C_0 n[(s^2+1)(n+1) - s(4n+1)]}{2(\phi + V_{B1})^2 (s+1)^2}. \quad (22)$$

Note that—as in (11)—$C_2$ (21) can be made equal to zero by setting $$s = \frac{4n+1 + \sqrt{12n^2 - 3}}{2(n+1)} \quad (23)$$

resulting in zero third-order distortion caused by the capacitance term $C_2$. The result of (23) demonstrates that cancellation can only occur for cases where the diode power-law exponent is equal or greater than 0.5. The second root of (23) (and from (11)) can be neglected because the two roots are inverses of each other; diode area ratios of value s and 1/s both result in $C_2$=0. Simulations have shown that a deviation of more than 25% of the calculated ratio s essentially eliminates the desired distortion cancellation effect. Accordingly, in exemplary embodiments, devices meet the ratio s with a deviation of 25% or less.

A constant doping profile in the diode (the so-called "abrupt junction" case where n=0.5) results in a value of s of unity, as has been previously recognized. This case is particularly attractive because—from (15)—this set of conditions (n=0.5, s=1), sets both $C_2$ and $C_1$ equal to zero. A more elaborate analysis shows that all higher order distortion terms vanish, yielding (in theory) a "distortion-free" operation for this unique case The explanation for this desirable "distortion free" behavior can be intuitively seen from rewriting (1) for the diode stored charge as a function of the applied voltage for the n=0.5 case, i.e.

$$V = \phi\left(\frac{Q_0^2 - Q^2}{Q_0^2}\right) \quad (24)$$

where $Q_0 = 2K/\phi^{n-1}$.

When an incremental voltage v is applied to the diode pair, an incremental charge q is stored in the diodes, and the incremental voltage—in terms of the stored charge is:

$$v = V_A + V_B \quad (25)$$
$$= \phi\left(\frac{Q_0^2 - (Q+q)^2}{Q_0^2}\right) - \phi\left(\frac{Q_0^2 - (Q-q)^2}{Q_0^2}\right)$$
$$= \frac{4\phi Q}{Q_0^2} q$$
$$= \frac{2}{C_0} q$$

So, the incremental charge has a linear relationship with the applied incremental voltage in the special case of n=0.5, and the diode pair acts like an ideal voltage-controlled linear capacitor. This principle of producing a linear controlled source from the difference between two square-law controlled sources has been used extensively in the design of linear MOS transconductors that exploit the square law behavior of long channel MOSFETs. See, e.g., E. Seevinck and R. Wassenaar, "A versatile CMOS linear transconductor/square-law function circuit," IEEE Journal of Solid-State Circuits, vol. SC-22, no. 3, pp. 366-377, June, 1987.

This result can also be used to calculate the ideal center-tap voltage for the special case of n=0.5, $$\Delta V_{CT} = \frac{\Delta V}{2} - \left(\frac{C}{C_0}\right)^2 \frac{(\Delta V/2)^2}{\phi} \quad (26)$$

which exhibits only the fundamental frequency and second-order distortion.

For process technologies that allow a higher capacitance tuning range (n>0.5) the solution of (23) provides a direct way to calculate the required diode area ratio to minimize $C_2$. For example, in the case where n=1, the required area ratio is exactly two. In the case of n=2, which corresponds to the ideal hyper-abrupt junction, the required area ratio is 2.6. These area ratios are straightforward to realize with high accuracy in any standard integrated circuit process that includes varactor diodes.

Although this approach can minimize $C_2$, it is clear from our previous analysis that a value of s≠1 will result in a finite value of $C_1$. The placement of a matched varactor stack in anti-parallel configuration, as shown in FIG. 1A, this distortion contribution can be eliminated. The resulting linear capacitance of the varactor diode circuits of FIGS. 1A and 1B are identical, but the circuit of FIG. 1B, as represented by the capacitances in FIG. 2B, now has $C_1 = C_2 = 0$ when the proper area ratio is set. It should be noted that all the even-order distortion coefficients are zero ($C_1, C_3, C_5, \ldots = 0$) in this topology, but the higher coefficients that create odd-order distortion ($C_4, C_6, C_8, \ldots$) of FIG. 1B are not zero, although the IM3 contributions at ($2\omega_2 - \omega_1$) due to the $5^{th}$ and higher order nonlinearities are very small.

The circuit topology of FIG. 1A provides a substantially distortion-free varactor stack when s=1 and n=0.5, corresponding to a uniform doping profile of the varactors. The circuit of FIG. 1B is more generalized, however, and provides substantially distortion free varactor stack for any value n>0.5, by setting the proper ratio of the diode areas, which sets $C_1$ and $C_2$ to zero. This topology provides more freedom for use in different process technologies and facilitates linear operation with a higher $C_{max}/C_{min}$ ratio than the n=0.5 case.

The intercept points of the varactor topologies are a function of the control voltage and can be expressed analytically as shown in Table I, below. It is appropriate to express the intercept point values in voltage rather than the more traditional available power, since the available power to the diodes will depend on the impedance matching conditions.

TABLE 1

|  | IP2 | IP3 | IP4 |
|---|---|---|---|
| Single diode | $\dfrac{\phi + V_{n1}}{n}$ | $2\sqrt{\dfrac{2(\phi + V_{B1})^2}{n(n+1)}}$ | $2\left(\dfrac{-(\phi + V_{B1})^3}{n(n^2 + 3n + 2)}\right)^{\frac{1}{3}}$ |
| Distortion Free Varactor Stack | ∞ | ∞ | ∞ |
| High Tuning Range Varactor Stack (HTRVS) | ∞ | ≈3.4($\phi + V_{DC}$) | ∞ |

Table I shows the theoretical voltage intercept points for differing diode configurations. The calculated IP2, IP3, and IP4 for the High Tuning-Range Varactor Stack correspond to the n=1, s=2 condition. Since there is no $3^{rd}$-order distortion for this configuration, the IP3 value is the extrapolated intercept point of the residual $5^{th}$ order distortion at $2\omega_2 - \omega_1$.

To this point, it has been assumed that the dc biasing network of the center tap has a sufficiently high impedance so that it has no effect on the RF operation of the varactor stack configuration. However, in practical situations the shunting impedance of the center contact must be maximized to avoid linearity degradation. This occurs when the AC current through the bias network for the various harmonic components becomes significant compared to the desired AC current through the diodes. In this situation, the conditions for distortion cancellation are violated. This is especially a problem for intermodulation measurements at small tone spacings since, from (26), the center tap voltage has a component at the difference frequency of a two-tone test. Since the capacitive reactance increases without bound as the frequency goes to zero, there is a lower frequency limit of tone spacing where the intermodulation cancellation effect is effective. Referring to the configuration of FIGS. 1A and 2A, this condition is $$R_{01} \gg \frac{1}{2\pi C_A \Delta f} \quad (27)$$

This condition can be satisfied by an integrated resistor, but the resistance value can become prohibitively large for even moderate tone spacings. In the regime of ultra-low tone spacing, where (27) cannot be satisfied, the $IP_3$ improvement over a single diode (slightly more than a factor two) can be almost entirely explained by the factor two reduction in RF voltage across each diode.

Figure 3:
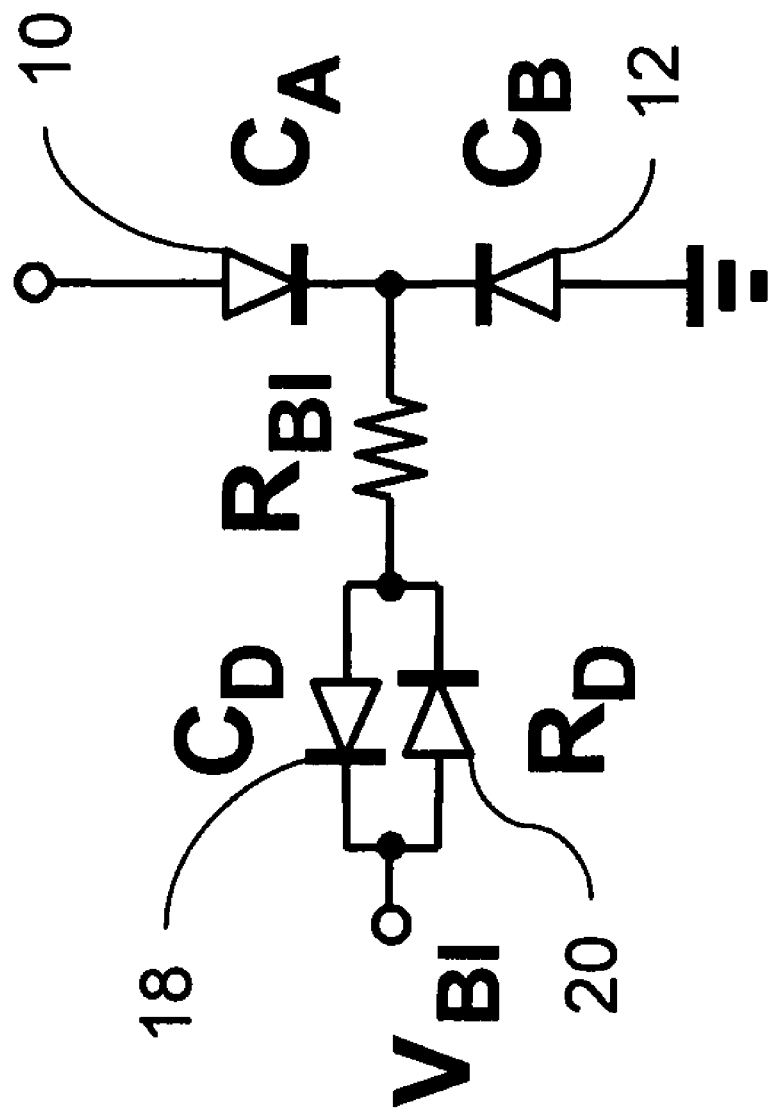
FIG. 3 illustrate an anti-parallel diode bias configuration applied to the FIG. 1A topology.

A better way to implement the high impedance at the center-tap while keeping the area required for the bias circuit small is the use of a small anti-parallel diode pair is shown by the topology depicted in FIG. 3, where anti-parallel diode bias is provided by a pair of varactor diodes $C_D$ (18) and $R_D$. (20). This is quite effective for most applications, since the zero bias impedance of the diodes is very high.

Figure 4:
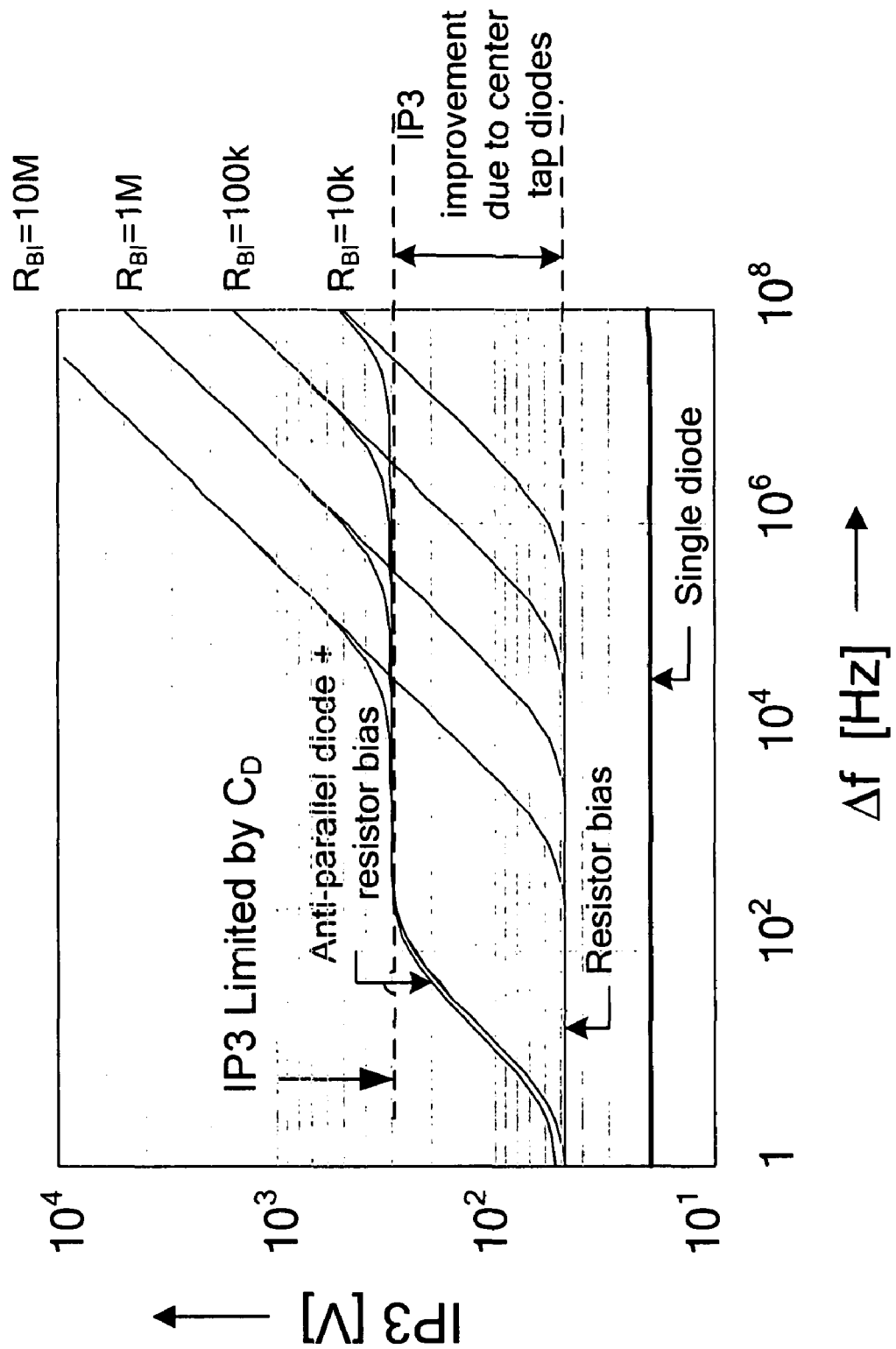
FIG. 4 shows simulated IP3(V) for a single varactor and a voltage driven DFVS under a two-tone test as function of the tone spacing and center tap impedance.

The effect of center-tap impedance on linearity is shown with a specific simulation example of IIP3 in FIG. 4. FIG. 4. shows simulated IP3(V) for a single varactor and a voltage driven DFVS under a two-tone test as function of the tone spacing and center tap impedance ($f_c$=1 GHz, $C_0$=10 pF, $V_{center\ tap}$=5V, n=0.5, $C_D$=0.1 pF). The figure shows three distinct regions of operation: the shunt dc leakage impedance of the diodes $R_D$ limits the linearity at very low tone spacings, the zero-bias capacitance $C_D$ of the anti-diode pair limits the IIP3 to a constant value at moderate tone spacings, and the linearity approaches the ideal infinite IIP3 at high tone spacings. In the moderate tone spacing regime, where the anti-parallel biasing diode capacitance limits the linearity, the IIP3 is given by $$IIP3(V) = \sqrt{\frac{2C_0^2(2C_0+C_D)^4}{3C_1^2 C_D(C_D^3+4C_0C_D^2+6C_0^2C_D+2C_0^3)}} \quad (28)$$

which is approximately $$IIP3(V) \approx 8(\phi+V_{BJ})\sqrt{\frac{C_0}{3C_D}} \quad (29)$$

for the uniformly doped n=0.5 case and for small values of $C_D$. This illustrates the importance of maintaining a low parasitic capacitance in the diode dc bias circuit.

Anti-parallel diodes in the center tap should not corrupt the intended RF signal flow. Ideally, no RF current leaves through the center tap connection. Good performance should be realized for center tap connections that have a capacitance that is significantly lower, e.g. significantly less then 50% of the capacitance of diodes in the RF path.

FIG. 4. shows that the distortion-free varactor stack outperforms the single varactor in terms of linearity; however, the best results are obtained when the cut-off frequency of the dc bias network ($1/2\pi c_{eff}Z_s$) is much lower than the difference frequency. In addition to the requirement of high center tap impedance, the varactor diodes should not become forward biased nor exceed the diode voltage-breakdown conditions during the RF signal cycle. These technological constraints must be considered in practical RF applications requiring variable capacitance.

The varactor diodes in the above analysis have been considered as an ideal circuit element with a capacitance behavior as given by (16). However, when considering real devices, physical implementations and their related constraints need to be addressed. In particular, it is necessary to ensure that the extrinsic parasitic elements do not increase the loss and degrade the linearity. For this purpose, a simplified varactor diode structure, with an abrupt junction between an uniform lightly doped $N^-$ region and a much more heavily doped $P^+$ region will be used as an example. Calculations assume that the RF performance degradation due to the $P^+$ and $N^{++}$ contact region is negligible.

A first consideration is the intrinsic breakdown voltage and Quality Factor of this simplified structure. A subsequent consideration is the available capacitance control range for a uniformly doped varactor.

The varactor diode capacitance is given by:

$$C_t \approx \frac{\varepsilon A_j}{x_n} \quad (30)$$

where $\varepsilon$ is the silicon permittivity, $A_j$ is the diode area, and $x_n$ is the depletion width given by $$x_n = \sqrt{\frac{2\varepsilon N_a(\phi-V_j)}{qN_d(N_a+N_d)}} \text{ and } \phi = v_t \ln\left(\frac{N_aN_d}{N_i^2}\right)$$

where $N_a$, $N_d$ and $N_t$ are respectively; the acceptor, donor and intrinsic carrier concentrations, and $\kappa_t$ is the thermal voltage given by kT/q. In the rest of the calculations, assumptions are based upon silicon-based devices operating at 2 GHz, $N_a=10^{19}$ cm$^{-3}$ and a critical breakdown field for silicon $E_{crit}=6\times10^5$ V/cm.

Using the expression for $x_n$ the breakdown voltage can be determined by setting the maximum value of the electric field $E_{max}$ ($qN_dx_n/\varepsilon$) equal to the critical electrical field for silicon, yielding:

$$V_{break} = -\frac{\varepsilon}{2}\left(\frac{N_a+N_d}{qN_dN_a}\right)E_{crit}^2 + \phi. \quad (31)$$

Figure 5A:
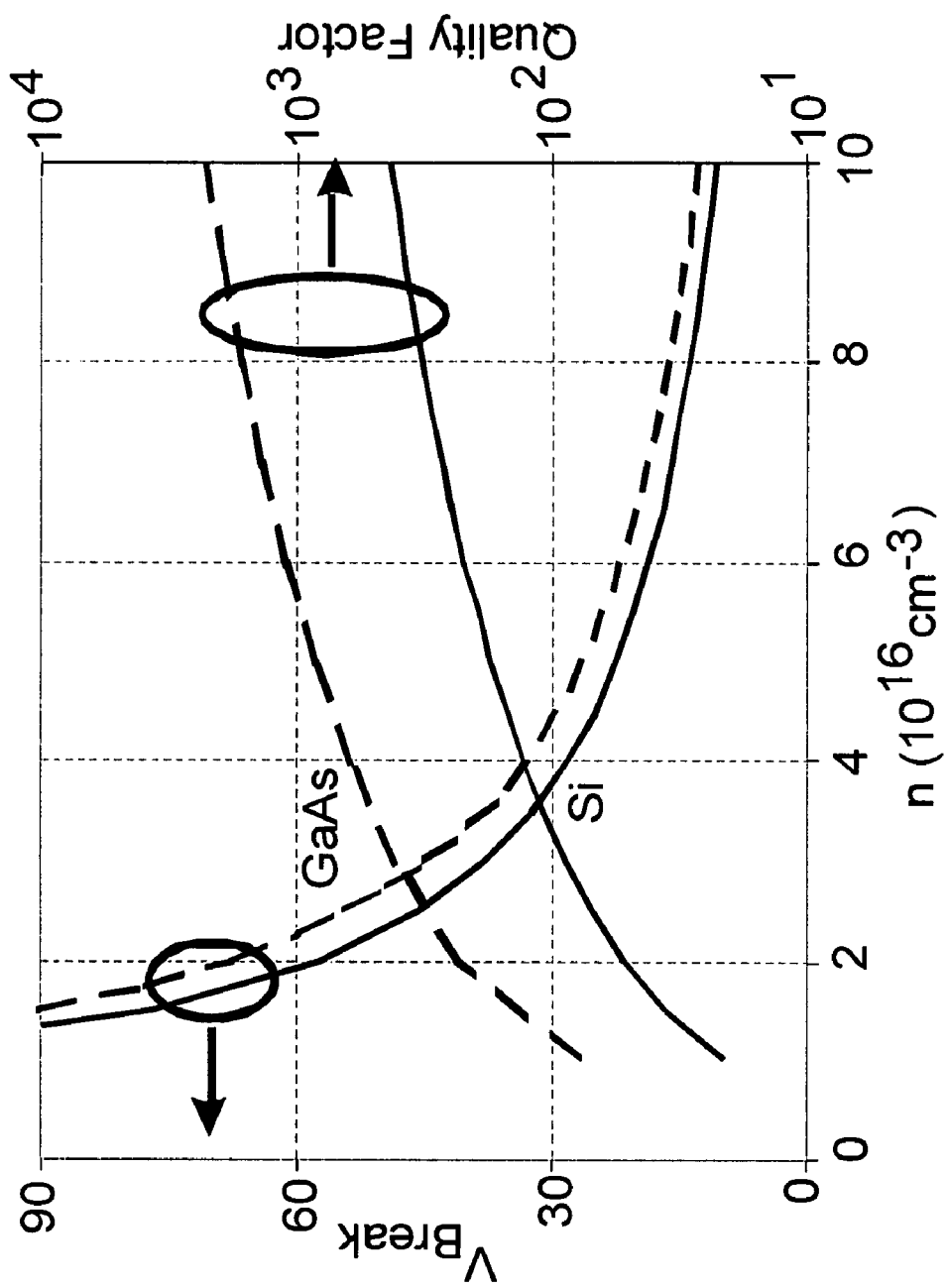
FIG. 5A plots the resulting breakdown voltage for a uniformly doped silicon varactor device, as function of doping concentration.
Figure 5B:
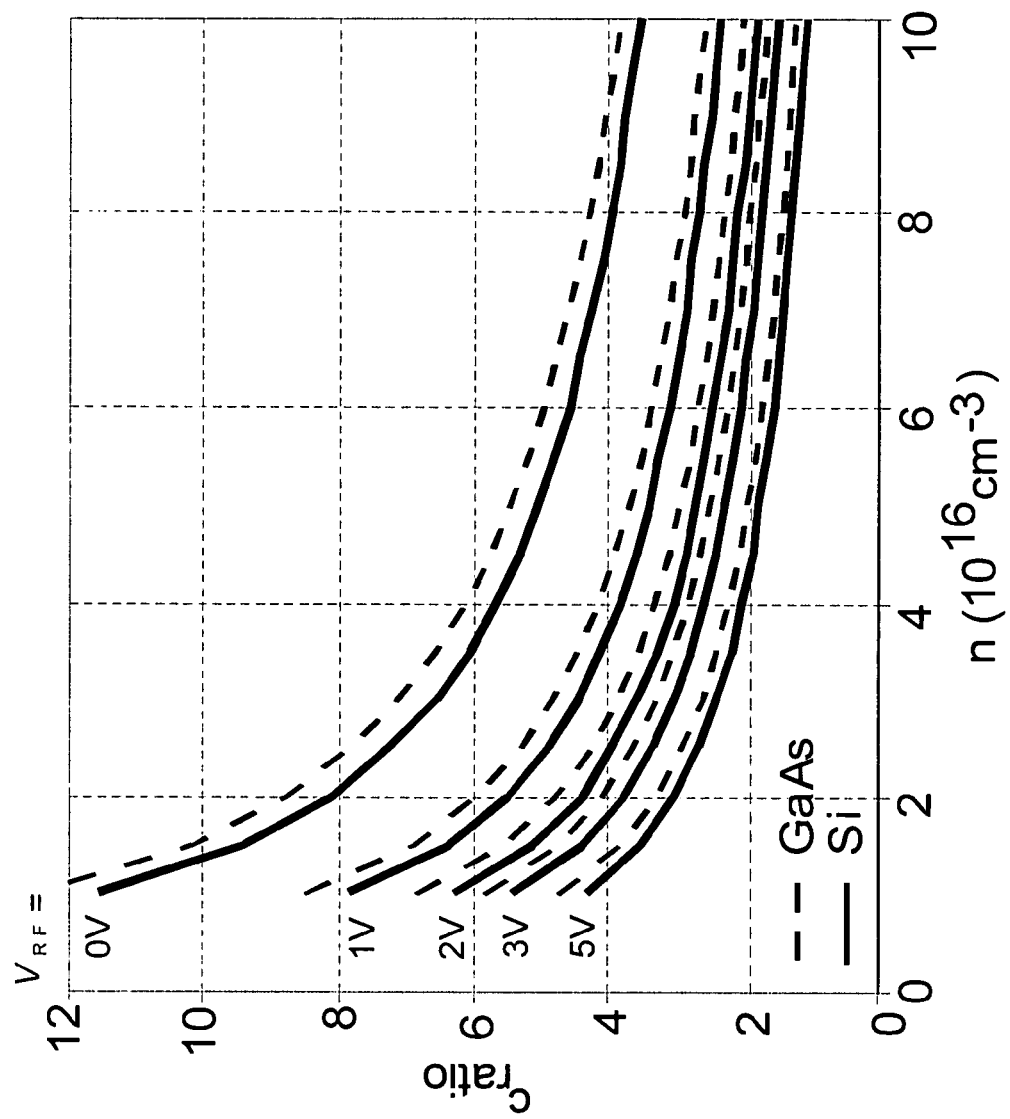
FIG. 5B plots effective single varactor diode capacitance tuning ratio ($c_{ratio}$) for silicon (solid lines) and GaAs (dashed lines) based varactor diodes at different RF voltage amplitudes as function of doping.

FIG. 5A plots intrinsic quality factor and breakdown voltage for silicon (solid lines) and GaAs (dashed lines) varactor diodes as a function of doping. FIG. 5B plots effective single varactor diode capacitance tuning ratio ($c_{ratio}$) for silicon (solid lines) and GaAs (dashed lines) based varactor diodes at different RF voltage amplitudes as function of doping. FIG. 5A plots the resulting breakdown voltage for a uniformly doped silicon varactor device, as function of doping concentration. As the doping level is lowered, the resulting breakdown voltage of the diode increases. But unfortunately, the series resistance of the undepleted region also increases, lowering the effective Q of the structure.

The Q of a varactor is defined as:

$$Q = \frac{\text{Im}(Z_{var})}{\text{Re}(Z_{var})} \quad (32)$$

where $Z_{var}$ is the series impedance of the varactor diode. The diode series resistance is assumed to be completely dominated by the effective resistance of the undepleted N region (without contact resistances). Assuming the worst-case series resistance corresponds to the completely undepleted situation, we can write:

$$R_{var} = \frac{\varphi_{Si} l}{A_j} \approx \frac{x_n}{q N_d \mu_n A_j} \quad (33)$$

The length l is set to the thickness of the lightly-doped N region, which follows from the maximum depletion width for a given doping concentration. Furthermore, $\phi_{Si}$ represents the doping dependent resistivity of silicon, which, based on room-temperature data for the doping range of $10^{15} \sim 10^{18}$ cm$^{-3}$, is approximately $$\varphi_{Si} = \frac{4 \times 10^{12}}{N_d^{0.8}} \quad (34)$$

Using (30)-(34), the Q of the varactor diode is calculated in FIG. 5A versus doping concentration for the zero-bias condition. This situation represents the worst-case condition, since the Q tends to improve for higher reverse bias of the diode, due to the decrease in capacitance as well as series resistance.

The result of this analysis is that, to maintain a Q of greater than 100 for a silicon device, the diode doping level must exceed $4 \times 10^{16}$ cm$^{-3}$ which limits the breakdown voltage to less than 30V. Although this represents an excellent level of performance, further Q enhancement can be achieved in a material system with a better mobility/breakdown voltage tradeoff, such as GaAs or other Group III-V materials.

The effective capacitance tuning range for a single diode as a function of doping concentration for different RF voltages for the uniformly doped case is plotted in FIG. 5B. Here again, there is a clear tradeoff between capacitance tuning range and Q; and a higher diode doping level improves the Q of the diode but lowers the achievable tuning range.

When considering the anti-series connection of two identical uniformly doped varactor diodes, the RF voltage across a single diode under low power conditions will be approximately half the RF voltage applied to the entire varactor stack. At higher power levels, the diode capacitances will be significantly modulated by the RF signal, and the voltage distribution between the two diodes will not be equal. In practice, this is not a problem, since the largest RF voltage will be across the smallest capacitance, which is offered by the most strongly reverse biased diode. This effect will slightly improve the usable capacitance tuning range compared to the results in FIGS. 5A and 5B, although in practice the improvement is rather small.

Figure 6:
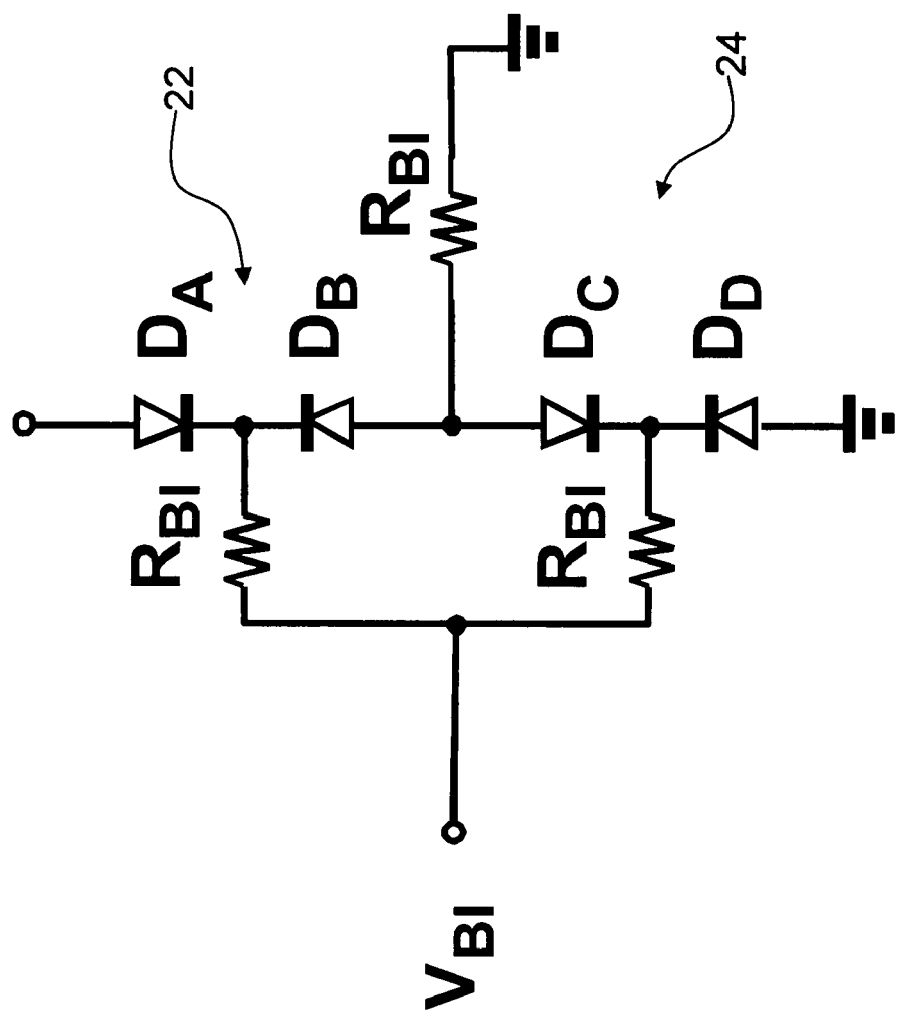
FIG. 6 illustrates a circuit topology with multi-varactor stacks in series to lower the RF voltage per diode and consequently improve the voltage handling and tuning range capabilities.

FIG. 6 illustrates a circuit topology with multi-varactor stacks 22 and 24 in series to lower the RF voltage per diode and consequently improve the voltage handling and tuning range capabilities. The voltage handling capabilities of the varactor stack can be improved by combining varactor diodes in series FIG. 6. This can yield a lower control voltage and a higher Q factor for a given signal level than a single varactor stack using a thicker epilayer, provided that the additional connections do not degrade the Q. The major penalty for this action is a larger device area for a given capacitance (roughly 4× the area for each doubling of the number of varactor diodes).

Figure 7:
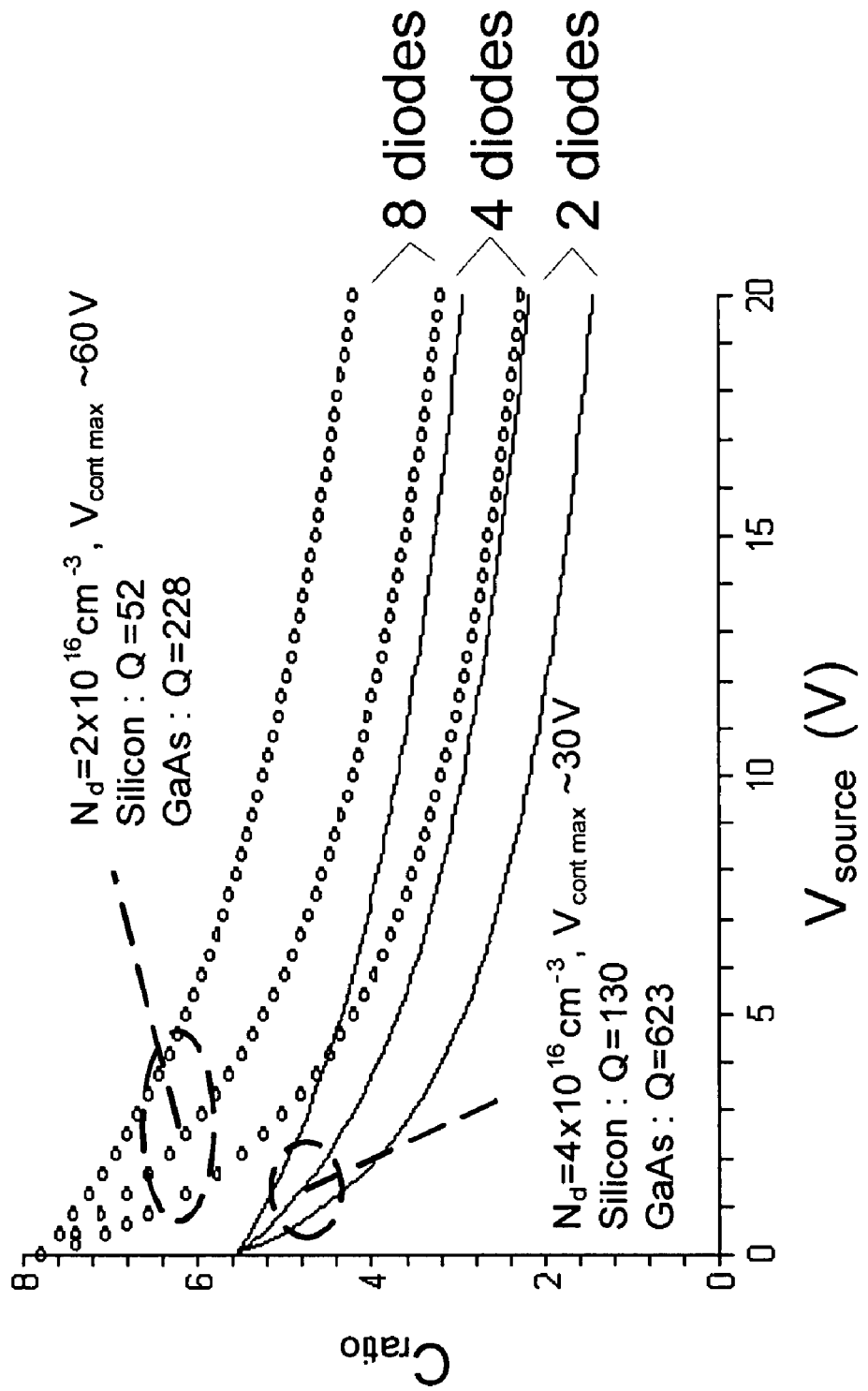
FIG. 7 shows calculated capacitance tuning ratio for the uniformly doped multi-stacked DFVS configuration, featuring 2, 4 and 8 anti-series diodes, ($N_d=2\times10^{16}$ and $N_d=4\times10^{16}$) as function of applied RF voltage.

The improvement in tuning range of these multiple varactor stacks for higher applied RF voltages is illustrated in FIG. 7. FIG. 7 shows calculated capacitance tuning ratio for the uniformly doped multi-stacked DFVS configuration, featuring 2, 4 and 8 anti-series diodes, ($N_d = 2 \times 10^{16}$ and $N_d = 4 \times 10^{16}$) as function of applied RF voltage. For simplicity it is assumed that a uniform voltage division over the diodes while $V_{source}$ represents the applied RF voltage over the whole (multi-) varactor stack. Note that GaAs based devices have a Q advantage over silicon due to the higher mobility, but GaAs provides basically no improvement in tuning range over silicon for a given uniform varactor doping concentration. The control voltage of these multi-varactor stacks is constrained by the breakdown voltage of a single varactor and is limited to ~30V and ~60V for $N_d = 4 \times 10^{16}$ and $N_d = 2 \times 10^{16}$ respectively.

Figure 8:
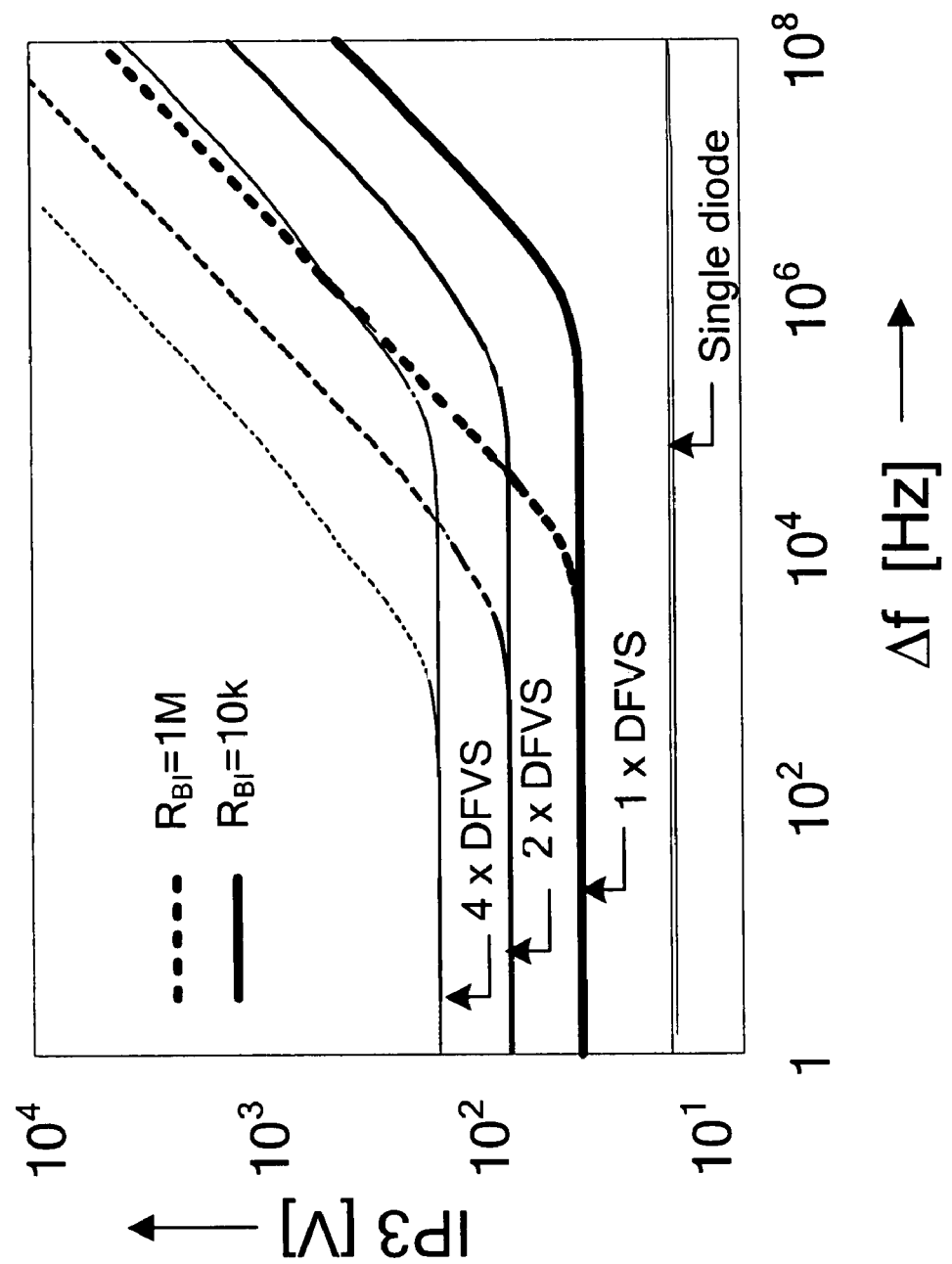
FIG. 8 shows simulated IP3(V) for a single reversed diode, and (multi)-DFVS varactor configurations, featuring 2, 4 and 8 anti-series diodes, as function of the tone spacing and center tap impedance ($f_c=1$ GHz, $C_{0\ eff}=10$ pF, $V_{center\ tap}=5$V, $n=0.5$, $C_D=0.1$ pF)

FIG. 8 shows simulated IP3(V) for a single reversed diode, and (multi)-DFVS varactor configurations, featuring 2, 4 and 8 anti-series diodes, as function of the tone spacing and center tap impedance ($f_c = 1$ GHz, $C_{0\,eff} = 10$ pF, $V_{center\,tap} = 5$V, n=0.5, $C_D = 0.1$ pF). The reduced voltage swing per diode in multi-stacked DFVS configurations is also directly beneficial for the linearity. This is illustrated in FIG. 8. where the IP3 (V) is given for a single diode, a DFVS, a multi-DFVS configuration with 4 anti-series diodes (as given in FIG. 6) and a multi-DFVS configuration featuring 8 anti-series diodes. FIG. 8 shows the exact doubling of the IP3 (V), at very low tone spacing, for each halving of the RF voltage per diode when utilizing multi-DFVS configurations. Also the requirement on the high center-tap impedance for a slightly higher tone-spacing seems to be somewhat relaxed, making the practical implementation of linear tunable narrowband applications easier.

The varactor diode stack can act as a controllable capacitor, whose value can be adjusted through the center tap voltage. In order to maintain acceptable linearity, each of the individual varactor diodes in the stack must remain sufficiently reversed biased during large-signals.

Although varactors have been around for decades and anti-series diode structures are used in oscillators or even, recently, for distortion reduction in electronically scannable antennas, it is believed that no commercially available varactor technology is currently suited to fulfill the demands for "distortion-free" operation, Q>100@2 GHz, and capacitance >10 pF.

Figure 9A:
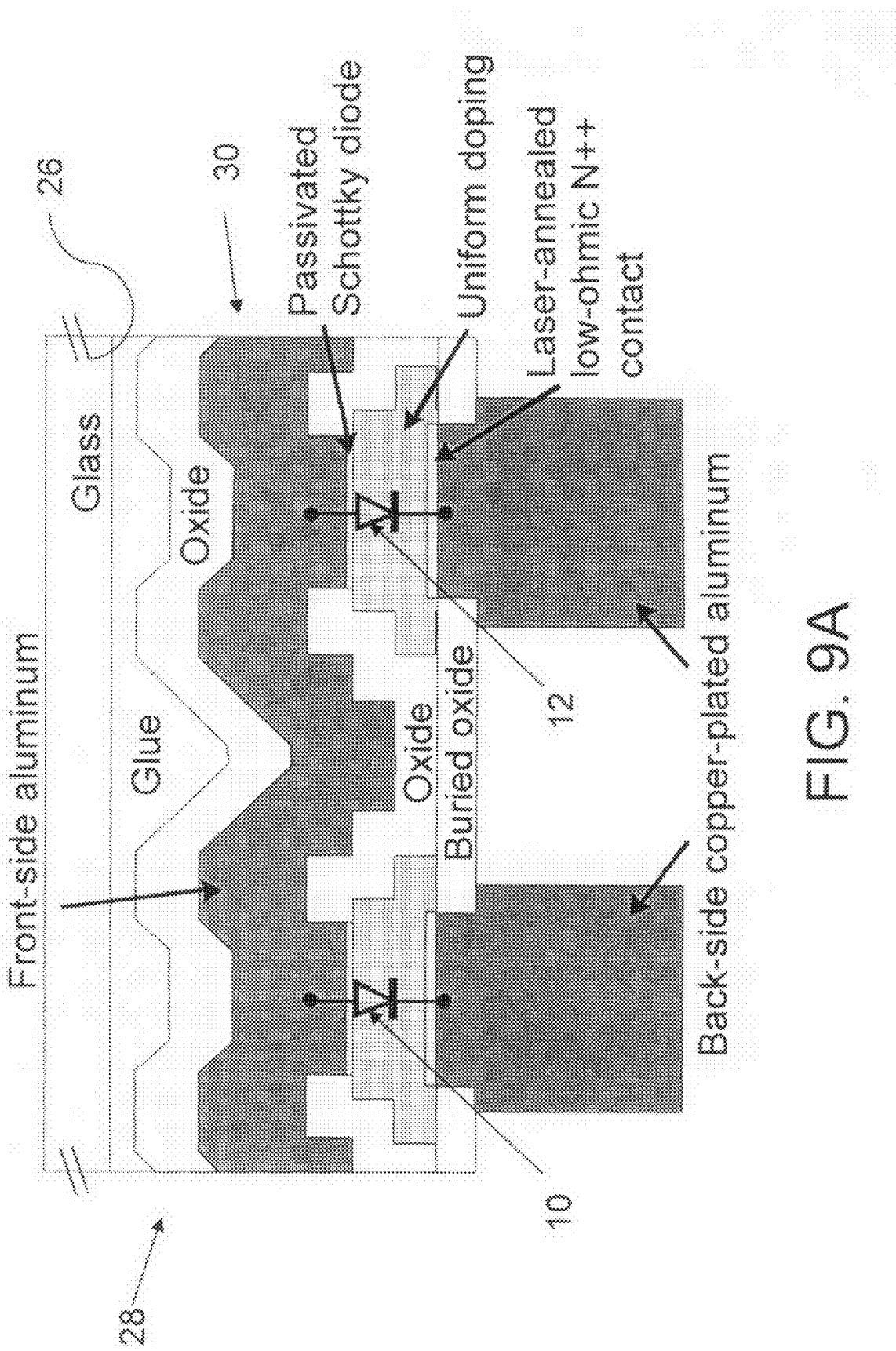
FIG. 9A shows a cross section of a silicon-on-glass varactor device integration of the invention.

A silicon-on-glass varactor device integration is provided and has been tested. FIG. 9A shows a cross section of a silicon-on-glass varactor device integration. In FIG. 9A a glass substrate 26 is attached to a silicon wafer 28. The diode topologies 10 and 12 are fabricated within a uniform doping region of the silicon wafer 28. Oxide and contact patterning 30 in the wafer 28 on both front and back sides of the wafer 28 permits the varactor diodes to be directly contacted on both sides of the wafer 28, which was done with copper plated aluminum in experimental devices.

Figure 9B:
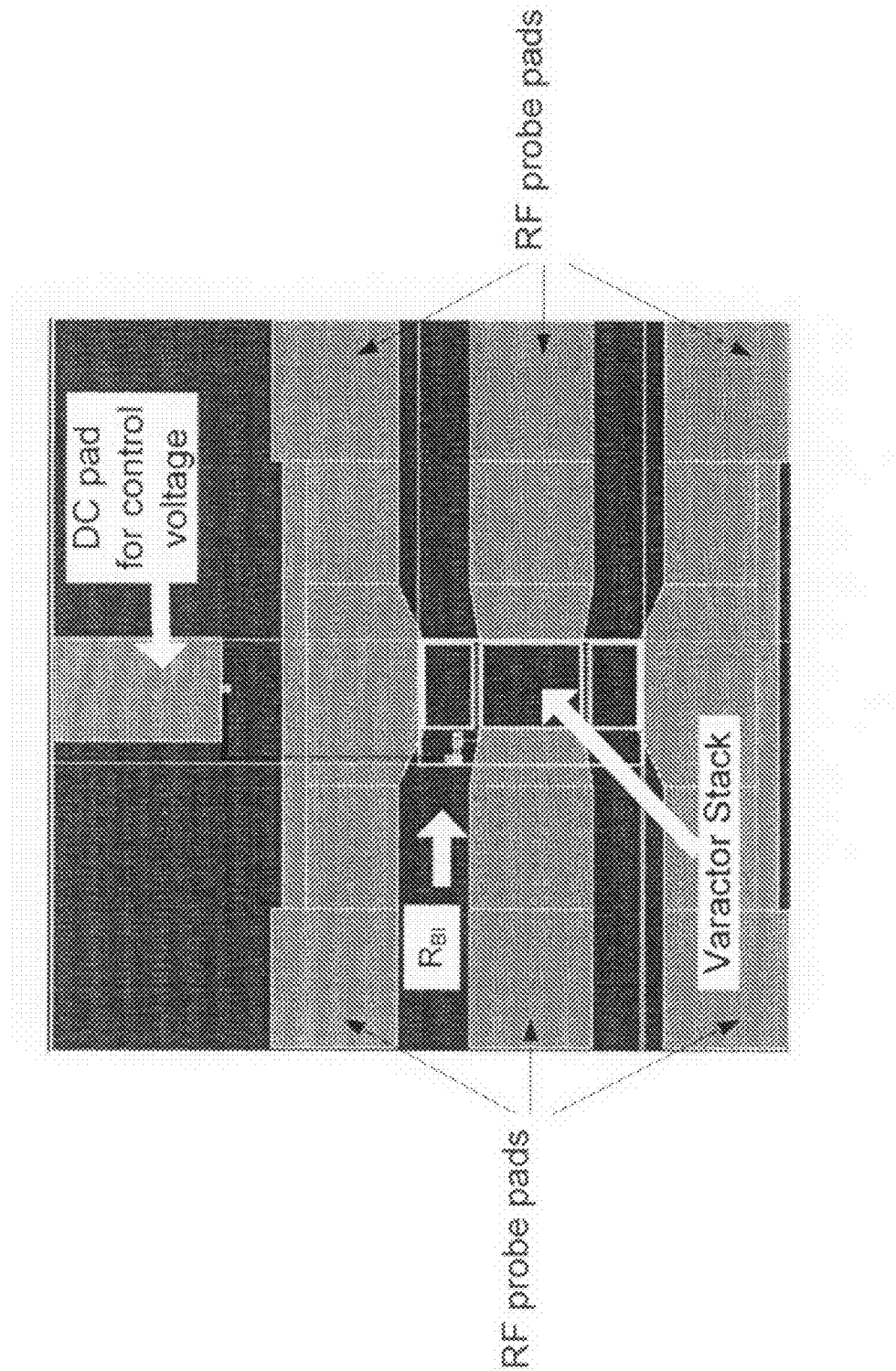
FIG. 9B shows the layout of an experimental device in accordance with FIG. 9A.

FIG. 9B shows the layout of an experimental device in accordance with FIG. 9A. The device of FIG. 9A provides a low loss substrate and patterning of both the front and back sides of the wafer so the intrinsic varactor can be directly contacted by thick metal on both sides. This eliminates the need for a buried layer or finger structures, as would be the case in conventional integrated varactor implementations. In the experimental device, a 4 μm copper layer has been plated on 1.4 μm aluminum, to minimize the metal losses.

The measured Q of DFVS structures realized in the experimental devices (using a uniform doping of $1 \times 10^{17}$ cm$^{-3}$) varied from 100 to 600 as the bias voltage changed, due the decreasing length of the undepleted region at larger reverse bias voltages.

To test the level of "distortion-free" operation achieved, a two-tone test ($f_c = 2.14$ GHz) was performed on a single varactor and a DFVS using a 50Ω terminated two-port configuration. For the calibrated power measurement of all frequency components of interest, the system of described in M. Spirito, et al, "A novel active harmonic load-pull setup for on-wafer device linearity characterization," in 2004 IEEE MTT-S Int. Microwave Symp. Dig., Fort Worth, Tex., June 2004, pp. 1215-1218, was used.

Figure 10:
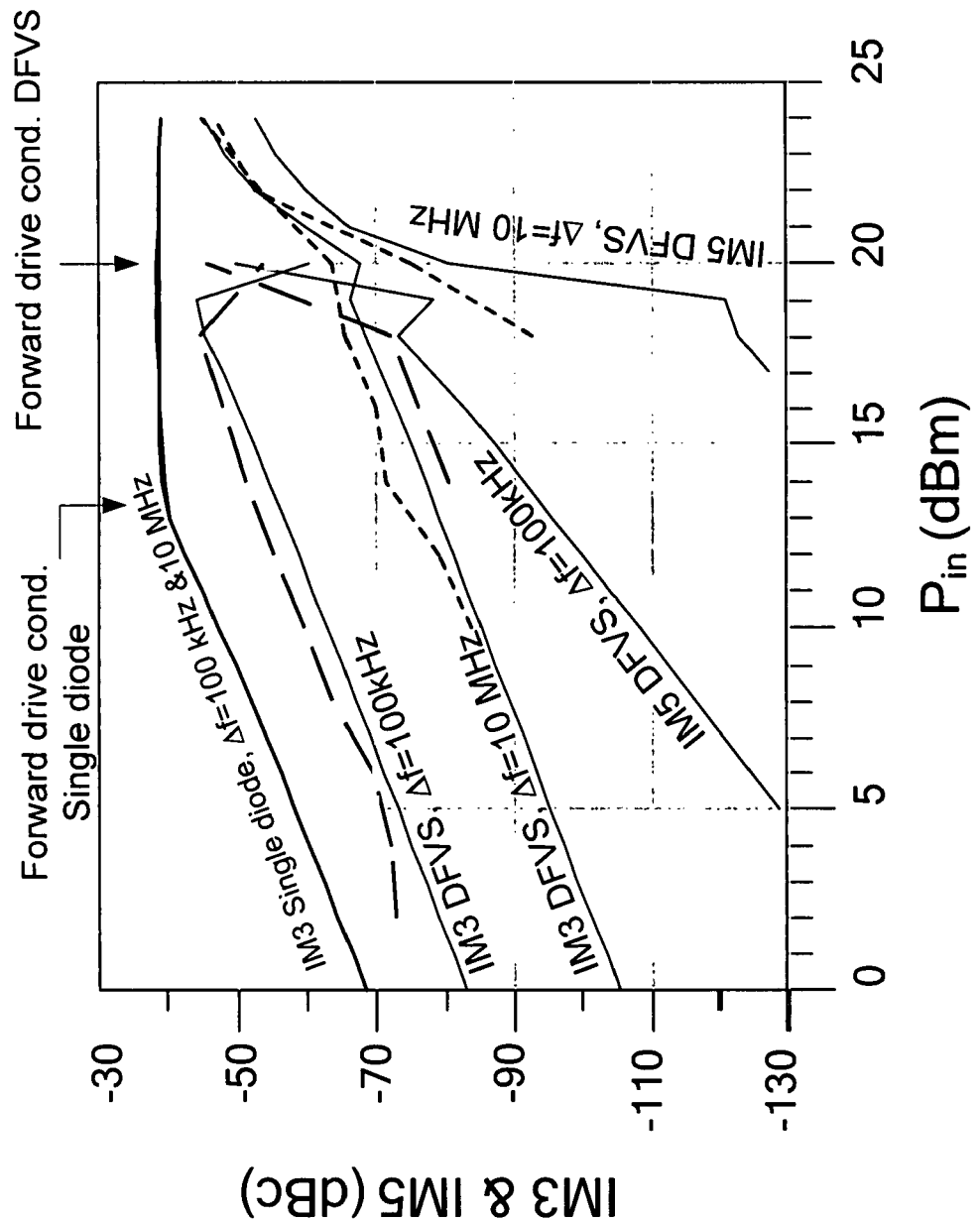
FIG. 10 plots the measured and simulated IM3 & IM5 components as function of power for different tone-spacing ($\Delta f=100$ kHz and $\Delta f=10$ MHz) of an experimental device using a center-tap impedance of 47 k$\Omega$ and a center-tap bias of 2V.

FIG. 10 plots the measured and simulated IM3 & IM5 components as function of power for different tone-spacing (Δf=100 kHz and Δf=10 MHz) using a center-tap impedance of 47 kΩ and a center-tap bias of 2V. These results match the theory presented above very well. There is a substantial improvement in linearity using the DFVS configuration over a single-varactor diode. Note that due to the fact that the RF voltage is split over the diodes of the DFVS, the forward drive conditions occur at a 6 dB higher power level for this configuration. The better suppression of the IM3 and IM5 products at the higher tone spacing is also clearly visible, supporting the theory introduced previously.

Several different experimental circuits have been implemented to verify the RF adaptivity features of varactor diode variable capacitor topologies of the invention, including a tunable bandpass filter and a low loss tuner. For these circuits an epi-layer of 1 μm, was employed, yielding a breakdown voltage for a single varactor diode of approximately 30V.

A bandpass filter was implemented and tested. The filter was simple tunable single-pole/single zero filter having the configuration shown in FIG. 11. The FIG. 11 filter can be adapted, for example, as a SAW filter replacement in a mobile handset, minimizing transmit leakage to the receiver/mixer in frequency-duplex cellular systems. The variable capacitors C1 and C2 in FIG. 11 were implemented with anti-series varactor diode arrangements consistent with FIG. 2A and sized equally (since n=0.5 for that case).

The requirements for such a filter are extremely low loss in the receive band, high rejection in the transmit band, and high linearity to avoid cross-modulation distortion. A combination of a low loss on-chip microstrip transmission lines and bondwires was utilized to create the required inductance.

Figure 11:
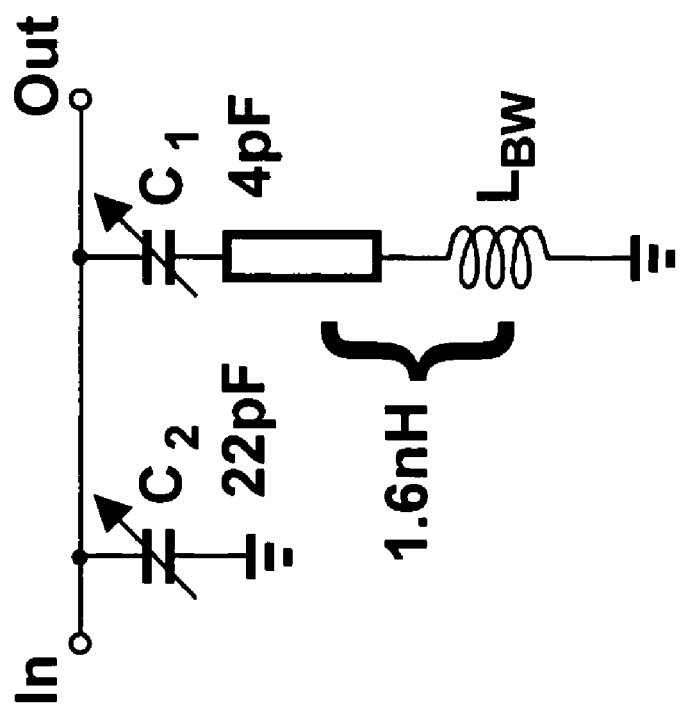
FIG. 11 shows an experimental band pass filter and FIG. 12 shows its response.
Figure 12:
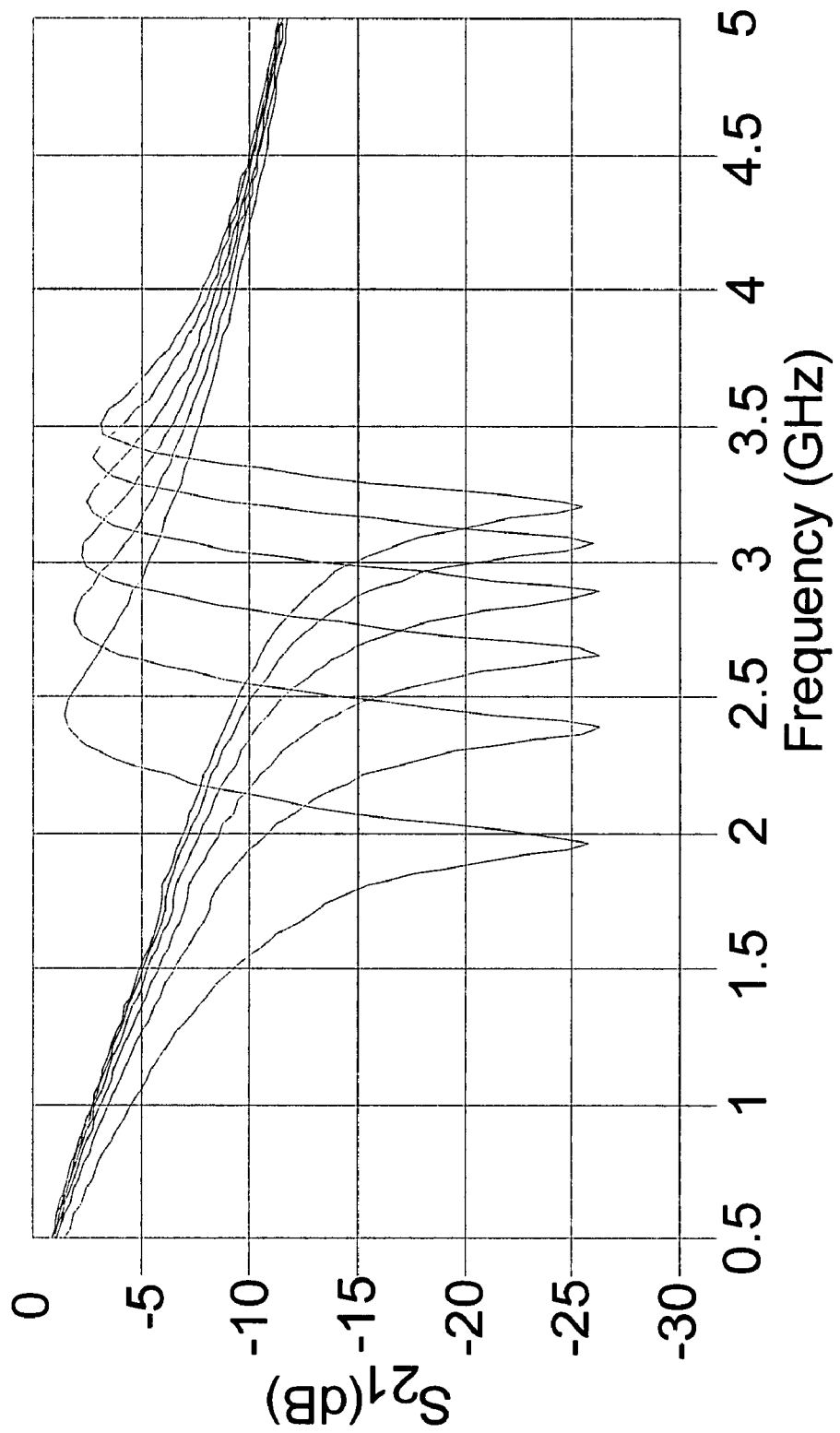

The measured tunable filter insertion loss and stopband suppression as $s_{21}$ versus frequency for the experimental device formed according to FIG. 11 is given in FIG. 12, and the loss in the passband is 2-3 dB over the 1 GHz variation. The transmit/receive channel-spacing for this filter is 400 MHz.

A triple-beat/XMOD distortion test was performed in order to characterize the large-signal behavior of experimental filters. For this purpose, two signals are presented in the stopband at 1.999 and 2.001 GHz with a power level of −5.6 dBm to account for the transmit-breakthrough signal. A jammer signal ($f_{jam}$=2.5 GHz, 0 dBm) signal is presented in the passband. The resulting distortion components at $f_{dist}$=2.498 and 2.502 GHz, are −98.5 dBc with respect to the jammer signal. The resulting IIP3 for this test condition is approximately $$IIP3 \approx 10 \log(2) + P_{tx1} - \Delta P_{xmod}/2 = 46 \text{ dBm}. \quad (35)$$

In addition, a two-tone test was performed in the passband of the tunable filter, also yielding an IIP3 of +46 dBm. These excellent results for the large-signal performance provide a wide design margin for a designer of adaptive wireless systems.

Figure 13:
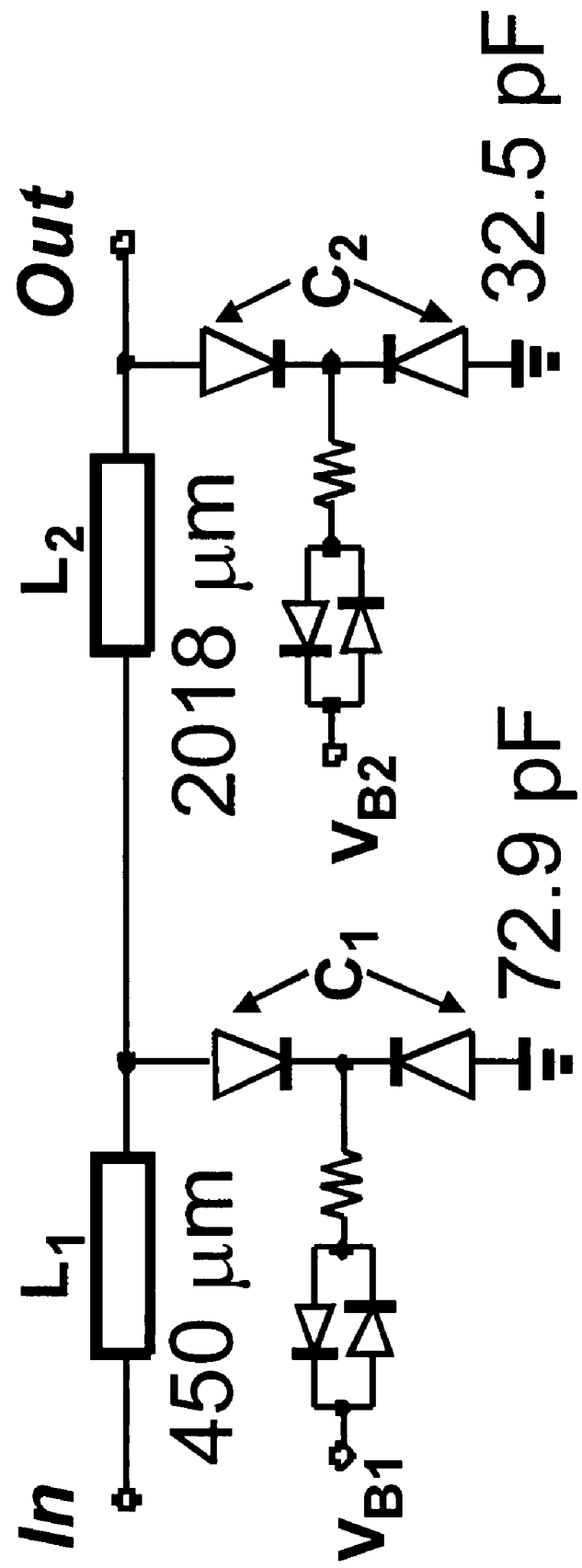
FIG. 13 is a schematic diagram of an experimental varactor diode-based tuner designed for a load impedance of 50$\Omega$.

Experimental integrated adaptive matching networks based on the two-stage ladder-matching network of shown in FIG. 13, which includes the FIG. 3, diode biased variable circuit topology, were formed using a doping level of $4 \times 10^{16}$ $cm^{-3}$ for the uniformly doped varactors to obtain a good tradeoff between tuning range, quality factor (Q>100 @ 2 GHz), and breakdown voltage (~30V).

The layout of the experimental tuner fabricated in accordance with FIG. 13 consisted of low loss coplanar transmission lines and varactor diodes arranged to continuously vary the impedance transformation. The topology was been selected for its ease of implementation and the low Q it offers for the high input power/low input impedance condition. There are only two control voltages (<18V) and the total structure is very compact (<3.5 mm$^2$). In contrast to MEMS based adaptive matching networks, the tuning speed of the varactor based matching network can be very fast, a property that can be used in a dynamic load-line amplifier.

FIG. 14A shows the measured values of $s_{11}$ at 2 GHz for the experimental tuner in accordance with FIG. 13. The FIG. 14A plots shows a close-to-ideal distribution of impedance points, which cover the ohmic control range of 0.2 to 49 ohm. A maximum VSWR>250:1 is seen in the data. An important parameter of a tuner is $G_p(=P_{out}/P_{in})$, which is the only true measure for the losses in power amplifier applications (note that $G_{max}$ was better than −0.2 dB for all tuner settings). FIG. 14B plots the measured loss contours (Gp in dB) at all the different tuning points, the losses range from 0.5 dB at 1Ω to 3.5 dB for $Z_{in}$=40Ω. The measured OIP3 of the tuner was 41 dBm for the $Z_{in}$=37 ohm case and 52 dBm for the $Z_{in}$=2 ohm case, with an input frequency of 2 Ghz and a tone spacing of 20 MHz.

The invention claimed is:

1. An integrated variable voltage diode capacitor topology applied to a circuit providing a variable voltage load for controlling variable capacitance, the topology comprising:
 a first pair of anti-series varactor diodes (10, 12, 14, 16), wherein the diode power-law exponent n for said first pair of anti-series varactor diodes in the circuit is equal or greater than 0.5, and said first pair of anti-series varactor diodes have an unequal size ratio that is set to control third-order distortion; and
 a center tap between said first pair anti-series varactor diodes for application of the variable voltage load; where the diode power law exponent n is defined by:

$$C(V) = \frac{K}{(\phi + V)^n}$$

where; ϕ is the built-in potential of the diode, V is the applied voltage, n is the power law exponent of the diode capacitance, and K is the capacitance constant.

2. The integrated variable voltage capacitor topology of claim 1, further comprising:
 a second pair of anti-series varactor diodes arranged antiparallel to said first pair of anti-series varactor diodes, wherein diode power-law exponent n for said second pair of anti-series varactor diodes in the circuit is equal or greater than 0.5, and said second pair of anti-series varactor diodes have an unequal size ratio that is set to control third-order distortion, wherein the combination of the first pair of anti-series varactor diodes and said second pair of anti-series varactor diodes control second-order distortion.

3. The integrated variable voltage capacitor topology of claim 2, further comprising stacked varactor diode pairs (22, 24) for each of said first and second pairs of anti-series varactor diode pairs.

4. The integrated variable voltage capacitor topology of claim 1, further comprising a stacked varactor diode pair in series with said first varactor diode pair.

5. The integrated variable voltage capacitor topology of claim 1, further comprising a bias anti-parallel varactor diode pair (18, 20) with resistance bias connected to said center tap.

6. The integrated variable voltage capacitor topology of claim 5, wherein a capacitance of said bias anti-parallel varactor diode pair is less than 50% of said first pair of anti-series varactor diode pair.

7. The integrated variable voltage capacitor topology of claim 1, wherein said unequal size ratio is s, and is defined by:

$$s = \frac{4n + 1 + \sqrt{12n^2 - 3}}{2(n+1)}$$

and said unequal size ratio s is met with a deviation of 25% or less.

8. The integrated variable voltage capacitor topology of claim 7, further comprising:

a second pair of anti-series varactor diodes arranged anti-parallel to said first pair of anti-series varactor diodes, wherein diode power-law exponent n for said second pair of anti-series varactor diodes in the circuit is equal or greater than 0.5, and said second pair of anti-series varactor diodes have said unequal size ratio s with a deviation of 25% or less.

9. A tunable filter, comprising:

integrated variable voltage capacitor topologies according to claim 8 arranged in a bandpass filter arrangement, and an input and output.

10. The integrated variable voltage capacitor topology of claim 1, implemented in a silicon on glass material system comprising:

a glass substrate;

a silicon wafer attached to said glass substrate, said topology being fabricated within said silicon wafer;

oxide and contact patterning in said wafer, said patterning conducted on both front and back sides of said wafer to permit the varactor diode pairs to be directly contacted on both sides of the wafer.

* * * * *

UNITED STATES PATENT AND TRADEMARK OFFICE
CERTIFICATE OF CORRECTION

| | | |
|---|---|---|
| PATENT NO. | : 7,902,585 B2 | |
| APPLICATION NO. | : 11/920935 | |
| DATED | : March 8, 2011 | |
| INVENTOR(S) | : Larson et al. | |

It is certified that error appears in the above-identified patent and that said Letters Patent is hereby corrected as shown below:

Col. 5, line 60    Please delete " $i_c = C_0 \frac{dv}{dt} + \frac{C_1}{2}\frac{dv^2}{dt} + \frac{C_2}{3}\frac{dv^3}{dt} +$ ," and insert -- $i_c = C_0 \frac{dv}{dt} + \frac{C_1}{2}\frac{dv^2}{dt} + \frac{C_2}{3}\frac{dv^3}{dt} + .....$ -- therefor.

Col. 6, line 3    Please delete " $C(v) = \frac{dQ}{dv} = C_0 + C_1 v + C_2 v^2 +$ " and insert -- $C(v) = \frac{dQ}{dv} = C_0 + C_1 v + C_2 v^2 + .....$ -- therefor.

Col. 6, line 19    Please delete " $Q(v_x) = \int_0^{v_x} C(v) dv$ " and insert -- $Q(v_x) = \int_0^{v_x} C(v) dv$ -- therefor.

Col. 6, line 34    Please delete " $v = S_0 Q + S_1 Q^2 + S_2 Q^3 +$ " and insert -- $v = S_0 Q + S_1 Q^2 + S_2 Q^3 + ...$ -- therefor.

Col. 6, line 37    Please delete " $S_0 = \left(\frac{1}{C_{A0}} + \frac{1}{2C_{B0}}\right),$ " and insert -- $S_0 = \left(\frac{1}{C_{A0}} + \frac{1}{C_{B0}}\right)$, -- therefor.

Signed and Sealed this
Fourth Day of October, 2011

David J. Kappos
*Director of the United States Patent and Trademark Office*

CERTIFICATE OF CORRECTION (continued)
U.S. Pat. No. 7,902,585 B2

Col. 6, line 44    Please delete "$S_2 = \dfrac{C_{A1}^2/2 - C_{A0}C_{A2}/3}{C_{A0}^5} + \dfrac{C_{B1}^2/2 - C_{B0}C_{D2}/3}{C_{B0}^5}.$" and insert -- $S_2 = \dfrac{C_{A1}^2/2 - C_{A0}C_{A2}/3}{C_{A0}^5} + \dfrac{C_{B1}^2/2 - C_{B0}C_{B2}/3}{C_{B0}^5}$ .-- therefor.

Col. 6, line 53    Please delete "$\begin{aligned} C &= C_0 + C_1 v + C_2 v^2 \\ &= \dfrac{1}{S_0} - \dfrac{2S_1}{S_0^3} v + \dfrac{6S_1^2 - 3S_0 S_2}{S_0^5} v^2, \end{aligned}$" and insert -- $\begin{aligned} C &= C_0 + C_1 v + C_2 v^2 \\ &= \dfrac{1}{S_0} - \dfrac{2S_1}{S_0^3} v + \dfrac{6S_1^2 - 3S_0 S_2}{S_0^5} v^2 \end{aligned}$ -- therefor.

Col. 7, line 50    Please delete "$C(v) = (C_{x0} + C_{y0}) + (C_{x1} - C_{y1})v + (C_{x2} + C_{y2})v^2 + \ldots$" and insert -- $C(v) = (C_{x0} + C_{y0}) + (C_{x1} - C_{y1})v + (C_{x2} + C_{y2})v^2 + \ldots$ -- therefor.

Col. 8, line 17    Please delete "$C_0 = \dfrac{K}{(\phi + V_{B1})^n},$" and insert -- $C_0 = \dfrac{K}{(\phi + V_{BI})^n}$, -- therefor.

Col. 8, line 20    Please delete "$C_1 = -C_0 \dfrac{n}{\phi + V_{B1}}$" and insert -- $C_1 = -C_0 \dfrac{n}{\phi + V_{BI}}$ -- therefor.

Col. 8, line 23    Please delete "$C_2 = C_0 \dfrac{n(n+1)}{2(\phi + V_{B1})^2},$" and insert -- $C_2 = C_0 \dfrac{n(n+1)}{2(\phi + V_{BI})^2}$, -- therefor.

Col. 8, line 36    Please delete "$C_0 = \dfrac{sK_A}{(1+s)(\phi + V_{B1})^n},$" and insert -- $C_0 = \dfrac{sK_A}{(1+s)(\phi + V_{BI})^n}$, -- therefor.

Col. 8, line 38    Please delete "$C_1 = \dfrac{(1-s)nC_0}{(1+s)(\phi + V_{BI})}$" and insert -- $C_1 = \dfrac{(1-s)nC_0}{(1+s)(\phi + V_{BI})}$ -- therefor.

CERTIFICATE OF CORRECTION (continued)
U.S. Pat. No. 7,902,585 B2

Col. 8, line 42  Please delete "$C_2 = \frac{C_0 n[(s^2+1)(n+1) - s(4n+1)]}{2(\phi + V_{B1})^2(s+1)^2}$." and insert -- $C_2 = \frac{C_0 n\left[(s^2+1)(n+1) - s(4n+1)\right]}{2(\phi + V_{BI})^2(s+1)^2}$. -- therefor.

Col. 8, line 67  After "sets", please delete "both $C_2$ and $C_1$" and insert -- *both $C_2$ and $C_1$* -- therefor.

Col. 9, line 1  After "shows that", please delete "all" and insert -- *all* -- therefor.

Col. 10, line 8  After "when", please delete "s=1 and n=0.5" and insert -- *s=1 and n=0.5* -- therefor.

Col. 10, line 11  After "for", please delete "any" and insert -- <u>any</u> -- therefor.

Col. 10, line 26  In Table 1, first row of col. IP2, please delete "$\frac{\phi + V_{n1}}{n}$" and insert -- $-\frac{\phi + V_{BI}}{n}$ -- therefor.

Col. 10, line 26  In Table 1, first row, col. IP3, please delete "$2\sqrt{\frac{2(\phi + V_{B1})^2}{n(n+1)}}$" and insert -- $2\sqrt{\frac{2(\phi + V_{BI})^2}{n(n+1)}}$ -- therefor.

Col. 10, line 26  In Table 1, first row, col. IP4, please delete "$2\left(\frac{-(\phi + V_{B1})^3}{n(n^2 + 3n + 2)}\right)^{\frac{1}{3}}$" and insert -- $2\left(\frac{-(\phi + V_{BI})^3}{n(n^2 + 3n + 2)}\right)^{\frac{1}{3}}$ -- therefor.

Col. 10, line 63  Please delete "$R_{01} \gg \frac{1}{2\pi C_A \Delta f}$" and insert -- $R_{BI} \gg \frac{1}{2\pi C_A \Delta f}$ -- therefor.

CERTIFICATE OF CORRECTION (continued)

U.S. Pat. No. 7,902,585 B2

Col. 11, line 36    Please delete "$IIP3(V) \approx 8(\phi + V_{BJ})\sqrt{\dfrac{C_0}{3C_D}}$" and insert -- $IIP3(V) \approx 8(\phi + V_{BJ})\sqrt{\dfrac{C_0}{3C_D}}$ -- therefor.

Col. 12, line 21    After "and", please delete "$\phi = v_i \ln\left(\dfrac{N_a N_d}{N_i^2}\right)$" and insert -- $\phi = v_t \ln\left(\dfrac{N_a N_d}{N_i^2}\right)$ -- therefor.

Col. 12, line 24    Please delete "$N_a$, $N_d$ and $N_i$," and insert -- $N_a$, $N_d$ and $N_i$ -- therefor.

Col. 12, line 26    Please delete "$K_t$" and insert -- $v_t$ -- therefor.

Col. 13, line 8    After "Furthermore", please delete "$\phi_{si}$" and insert -- $\varphi_{Si}$ -- therefor.

Col. 13, line 15    Please delete "$\varphi_{Si} = \dfrac{4 \times 10^{12}}{N_d^{0.8}}$" and insert -- $\varphi_{Si} = \dfrac{4 \times 10^{12}}{N_d^{0.8}}$ -- therefor.